US008227350B2

(12) United States Patent
West et al.

(10) Patent No.: US 8,227,350 B2
(45) Date of Patent: Jul. 24, 2012

(54) CONTROLLING DIAMOND FILM SURFACES AND LAYERING

(75) Inventors: Charles West, Chicago, IL (US); John Carlisle, Plainfield, IL (US); James Netzel, Romeoville, IL (US); Ian Wylie, Romeoville, IL (US); Neil Kane, Romeoville, IL (US)

(73) Assignee: Advanced Diamond Technologies, Inc., Romeoville, IL (US)

( * ) Notice: Subject to any disclaimer, the term of this patent is extended or adjusted under 35 U.S.C. 154(b) by 245 days.

(21) Appl. No.: 12/348,240

(22) Filed: Jan. 2, 2009

(65) Prior Publication Data
US 2009/0173950 A1 Jul. 9, 2009

Related U.S. Application Data

(60) Provisional application No. 61/019,175, filed on Jan. 4, 2008.

(51) Int. Cl.
*H01L 21/304* (2006.01)

(52) U.S. Cl. .................. 438/690; 438/699; 257/E21.23; 257/E21.215

(58) Field of Classification Search .................. 438/690, 438/699; 257/77, E21.23, E21.215, E29.003, 257/E23.141, E29.005
See application file for complete search history.

(56) References Cited

U.S. PATENT DOCUMENTS

| 4,434,188 | A |   | 2/1984  | Kamo et al.       |
|-----------|---|---|---------|-------------------|
| 4,987,007 | A |   | 1/1991  | Wagal et al.      |
| 5,204,145 | A |   | 4/1993  | Gasworth          |
| 5,209,916 | A |   | 5/1993  | Gruen             |
| 5,221,415 | A |   | 6/1993  | Albrecht et al.   |
| 5,328,676 | A |   | 7/1994  | Gruen             |
| 5,370,855 | A |   | 12/1994 | Gruen             |
| 5,441,591 | A |   | 8/1995  | Imthurn et al.    |
| 5,462,776 | A |   | 10/1995 | Gruen             |
| 5,523,121 | A |   | 6/1996  | Anthony et al.    |
| 5,561,303 | A | * | 10/1996 | Schrantz et al. ............. 257/77 |
| 5,614,258 | A |   | 3/1997  | Moskovits et al.  |
| 5,702,586 | A |   | 12/1997 | Pehrsson et al.   |
| 5,711,698 | A |   | 1/1998  | Chakraborty et al.|
| 5,747,120 | A |   | 5/1998  | McLean, II et al. |
| 5,772,760 | A |   | 6/1998  | Gruen et al.      |
| 5,834,094 | A |   | 11/1998 | Etsion et al.     |

(Continued)

OTHER PUBLICATIONS

U.S. Appl. No. 60/928,808, filed Jul. 13, 2007.

(Continued)

*Primary Examiner* — Zandra Smith
*Assistant Examiner* — Paul Patton
(74) *Attorney, Agent, or Firm* — Foley & Lardner LLP

(57) ABSTRACT

A method comprising: providing at least one first diamond film comprising polycrystalline diamond, e.g., nanocrystalline or ultrananocrystalline diamond, disposed on a substrate, wherein the first diamond film comprises a surface comprising diamond asperities and having a first diamond film thickness, removing asperities from the first diamond film to form a second diamond film having a second diamond film thickness, wherein the second thickness is either substantially the same as the first thickness, or the second thickness is about 100 nm or less thinner than the first diamond film thickness, optionally patterning the second diamond film to expose substrate regions and, optionally, depositing semiconductor material on the exposed substrate regions, and depositing a solid layer on the second diamond film to form a first layered structure. Applications include for example dielectric isolation in the semiconductor industry, as well as surface acoustic wave devices, scanning probe microscope, and atomic force microscope devices.

29 Claims, 16 Drawing Sheets

U.S. PATENT DOCUMENTS

| | | | |
|---|---|---|---|
| 5,849,079 | A | 12/1998 | Gruen et al. |
| 5,952,080 | A | 9/1999 | Etsion et al. |
| 5,989,511 | A | 11/1999 | Gruen et al. |
| 6,002,100 | A | 12/1999 | Etsion et al. |
| 6,046,430 | A | 4/2000 | Etsion et al. |
| 6,193,585 | B1 * | 2/2001 | Tanabe et al. ............ 451/41 |
| 6,348,240 | B1 | 2/2002 | Calvert et al. |
| 6,355,206 | B1 | 3/2002 | Hanzawa et al. |
| 6,592,839 | B2 | 7/2003 | Gruen et al. |
| 6,652,763 | B1 | 11/2003 | Wei et al. |
| 6,858,969 | B2 | 2/2005 | Bi et al. |
| 7,122,837 | B2 * | 10/2006 | Linares et al. ............ 257/77 |
| 7,394,103 | B2 * | 7/2008 | Gerbi ............ 257/77 |
| 7,799,599 | B1 * | 9/2010 | Sung ............ 438/105 |
| 2005/0031785 | A1 | 2/2005 | Carlisle et al. |
| 2005/0042161 | A1 | 2/2005 | Carlisle et al. |
| 2006/0131588 | A1 | 6/2006 | Gruen et al. |
| 2006/0222850 | A1 | 10/2006 | Xiao et al. |
| 2008/0099768 | A1 * | 5/2008 | Scarsbrook et al. ............ 257/77 |
| 2009/0017258 | A1 | 1/2009 | Carlisle et al. |
| 2009/0214826 | A1 | 8/2009 | West et al. |

OTHER PUBLICATIONS

Birrell et al., "Interpretation of the Raman Spectra of Ultrananocrystalline Diamond," Diamond & Related Materials, 2005, 14:86-92.

Birrell et al., "Morphology and Electronic Structure of Nitrogen-doped Ultrananocrystalline Diamond," Appl. Phys. Lett., Sep. 16, 2002, 81(12):2235-2237.

Gruen et al., "Characterization of nanocrystalline diamond films by core-level photoabsorption", Appl. Phys. Lett., Mar. 18, 1996, 68(12):1640-1642.

Gruen, "Nanocrystalline Diamond Films," Annu. Rev. Mater. Sci., 1999, 29:211-259.

May et al. "Experiment and modeling of the deposition of ultrananocrystalline diamond films using hot filament chemical vapor deposition and Ar/CH4/H2 gas mixtures: A generalized mechanism for ultrananocrystalline diamond growth." Journal of Applied Physics, 2006,100:024301-1 to 024301-9.

May et al. "Microcrystalline, nanocrystalline and ultrananocrystalline diamond chemical vapor deposition: Experiment and modeling of the factors controlling growth rate, nucleation and crystal size", Journal of Applied Physics, 2007,101:053115-1 to 053115-9.

May et al. "Reevaluation of the mechanism for ultrananocrystalline diamond deposition from $Ar/CH_4/H_2$ gas mixtures", Journal of Applied Physics, 2006,99:104907-1 to 104907-11.

Naguib et al., "Enhanced nucleation, smoothness and conformality of untrananocrystalline diamond (UNCD) ultrathin films via tungsten interlayers," Chemical Physics Letters, 2006, 430(4-6):345-350.

Schwarz, et al., "Dependence of the growth rate, quality, and morphology of diamond coatings on the pressure during the CVD-process in an industrial hot-filament plant," Diamond and Related Materials., 2002, 11:589-595.

Wang et al., "The fabrication of nanocrystalline diamond films using hot filament CVD", Diamond and Related Materials, 2004, 13(1):6-13.

Xiao et al., "Low Temperature Growth of Ultrananocrystalline Diamond", Journal of Applied Physics, Aug. 15, 2004, 96(4):2232-2239.

* cited by examiner

Figure 1. 50 X 50 μm Atomic Force Microscopy topographical map of representative "as-deposited" UNCD film showing narrow light-colored asperities Figure 2. 10 keV Scanning electron micrograph after a 90sec nano-diamond slurry polish UNCD surface

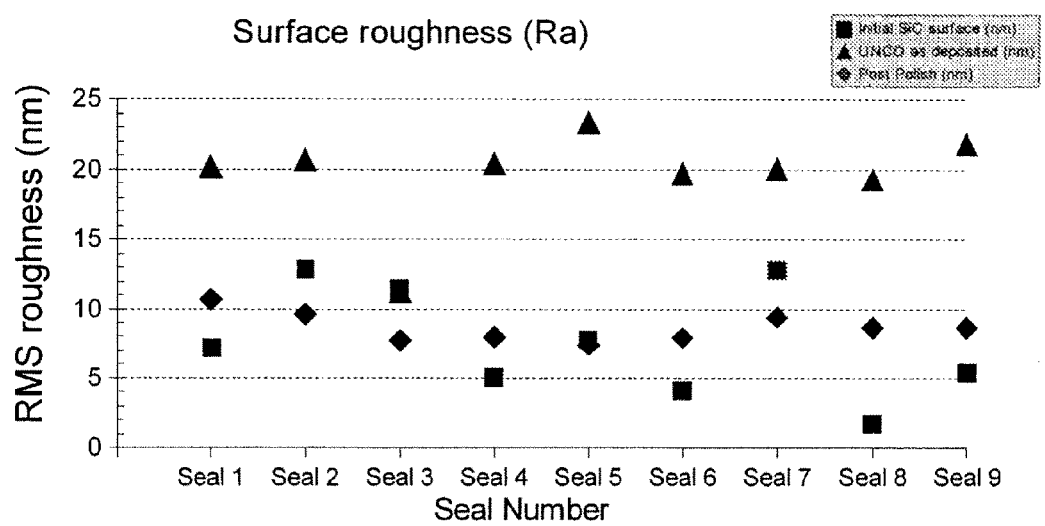
Figure 6. Measurements of the roughness of the initial SiC surface of pµmp seals, as-deposited UNCD films deposited on the seals, and the films after a short (90sec) diamond slurry polish Figure 7. Measurements of the asperity count (>100nm above average height) of the initial SiC surface of pump seals, as-deposited UNCD films deposited on the seals, and the films after a short (90sec) diamond slurry polish (average of 3 scans for each seal)
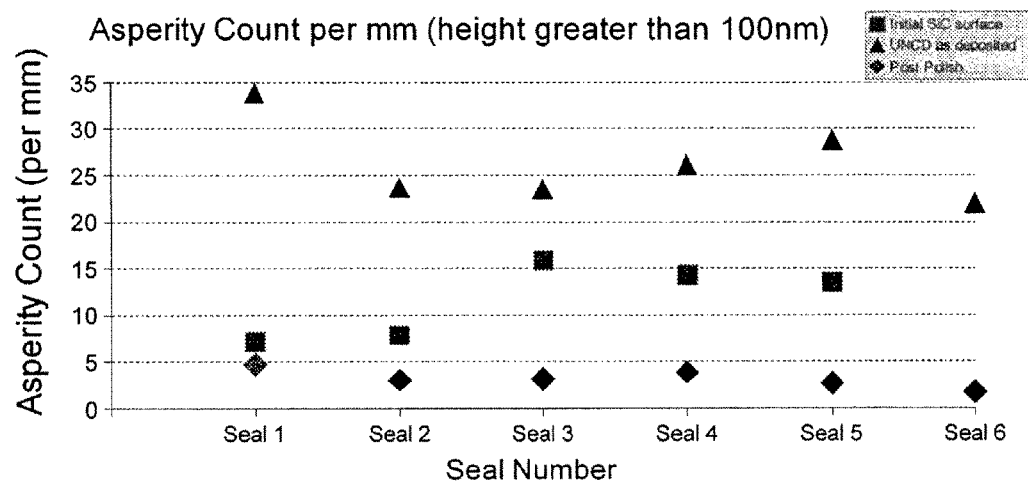

Figure 8: UNCD as an additional dielectric for DI
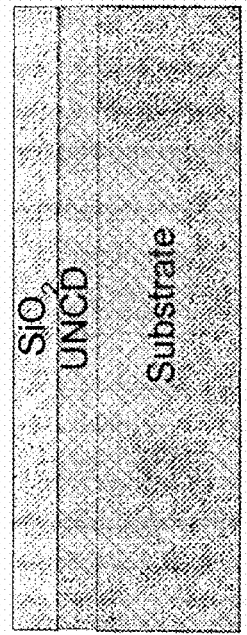
Figure 8a. UNCD deposition on substrate
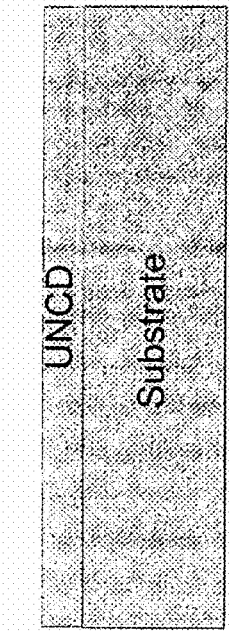
Figure 8c. Bonding between bonding layers
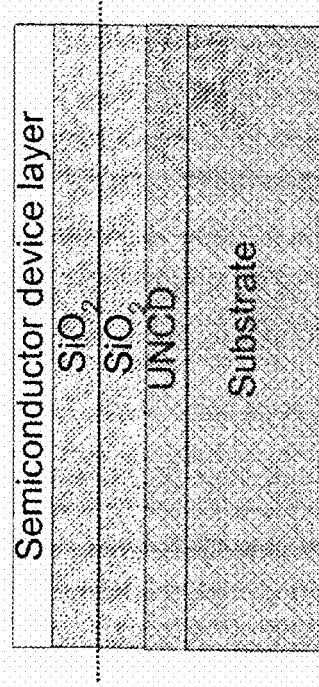
Figure 8b. Bonding layer dep (e.g. SiO₂)
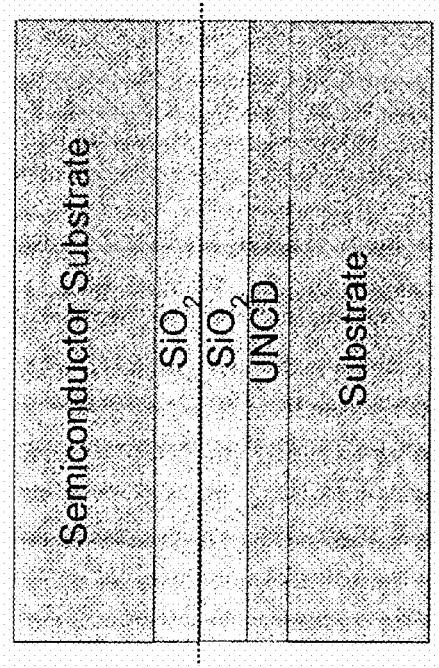
Figure 8d. Polish to form thin device layer

Figure 9. UNCD as an additional dielectric for DI and as polish stop for the device layer CMP
Figure 9a. UNCD deposition
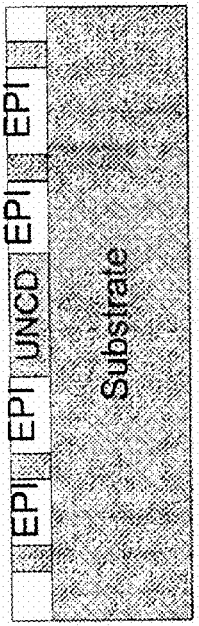
Figure 9b. Epitaxial growth of semiconductor
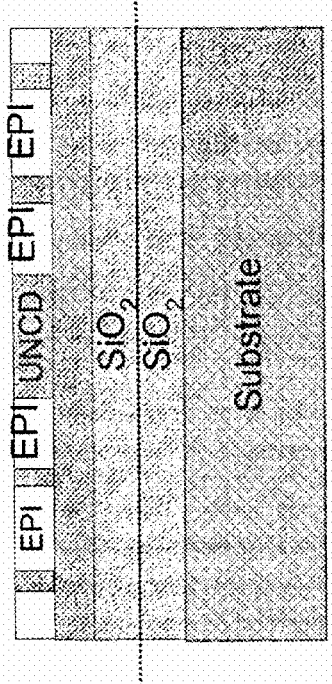
Figure 9c. Bonding between bonding layers
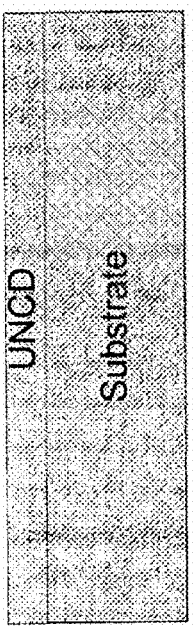
Figure 9d. Polish to form thin device layer
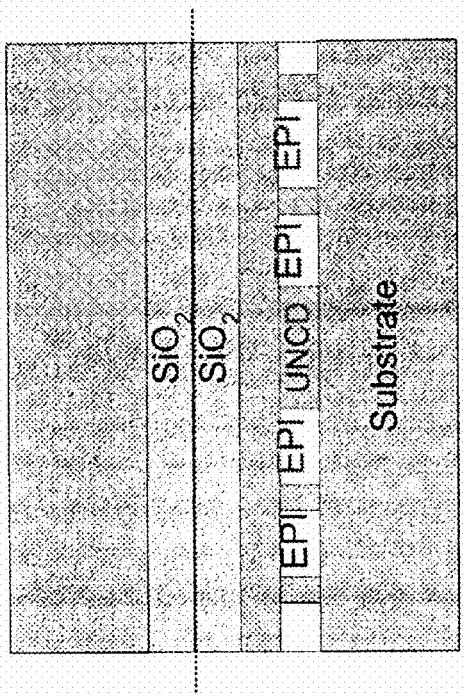

Figure 10. UNCD as an additional dielectric for DI and the use of Cu as a bonding layer
Figure 10a. UNCD deposition
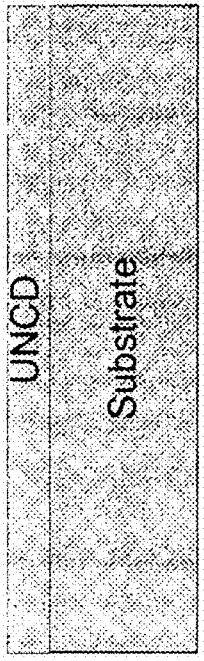
Figure 10b. Epitaxial growth of semiconductor and polishing
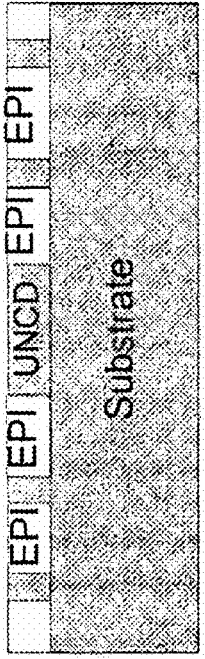
Figure 10c. Bonding between Cu bonding layers
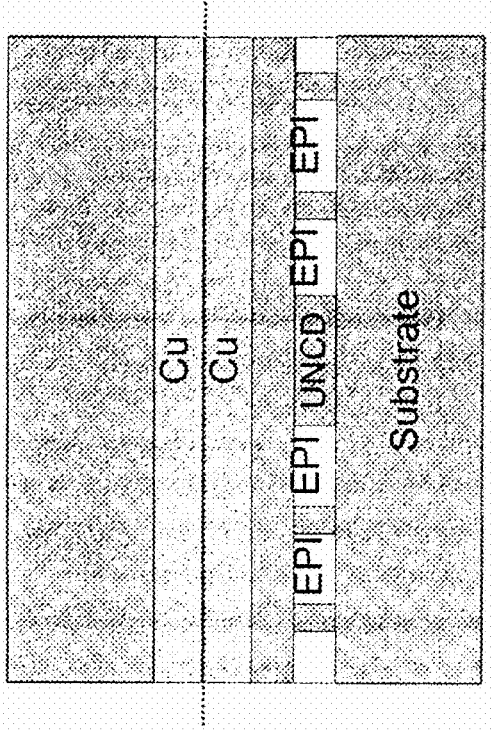
Figure 10d. Polish to form thin device layer
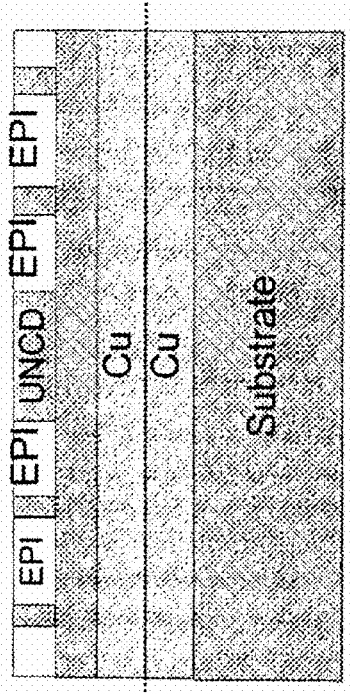

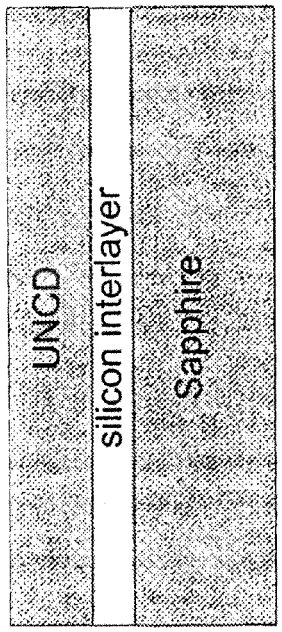
Figure 11. UNCD as a semiconductor layer for integrated circuits on a Sapphire substrate
Figure 11a. Starting SOS substrate
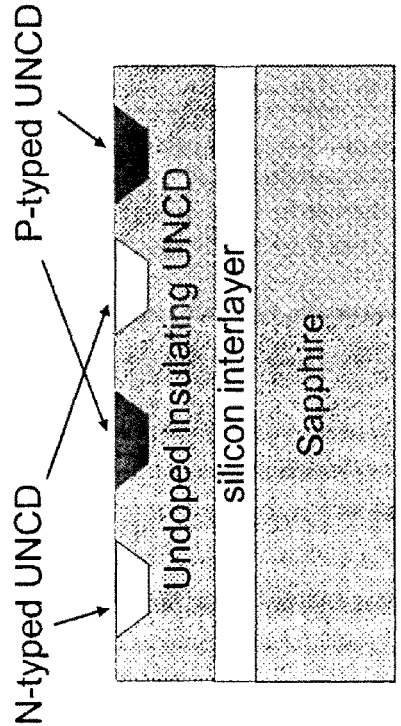
Figure 11b. UNCD deposition on SOS
Figure 11c. Doping and device formation in UNCD layer

Figure 12. UNCD as an additional dielectric for DI with Sapphire substrates
Figure 12a. UNCD deposition on substrate
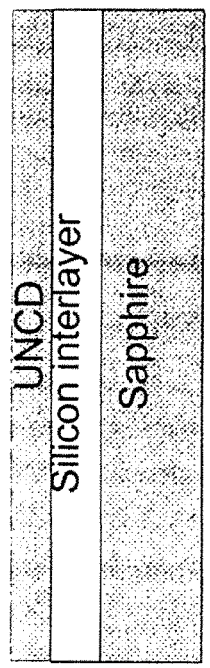
Figure 12b. Bonding layer dep (e.g. SiO$_2$)
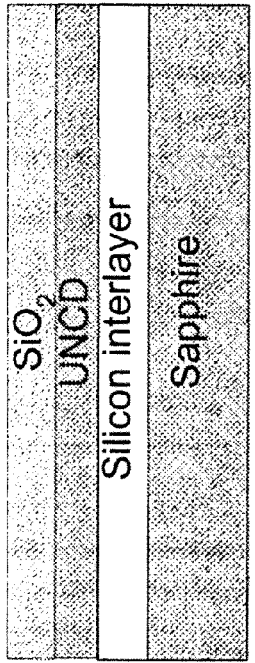
Figure 12c. Bonding between bonding layers
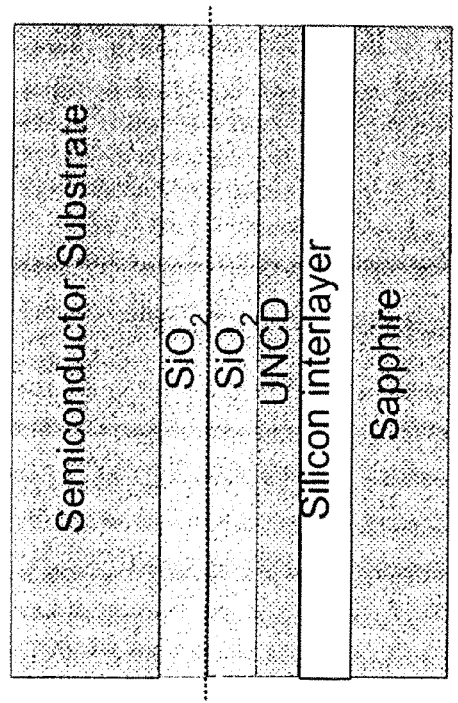
Figure 12d. Polish to form thin device layer
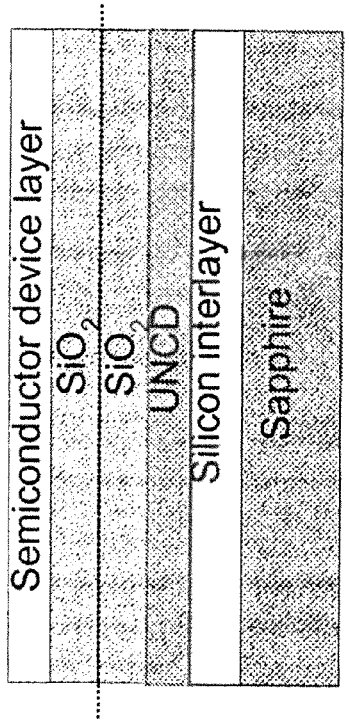

Figure 13. UNCD as an additional dielectric for DI and as polish stop for the device layer CMP on sapphire
Figure 13a. UNCD deposition
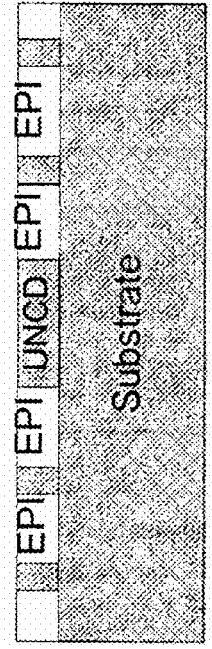
Figure 13b. Epitaxial growth of semiconductor and polishing
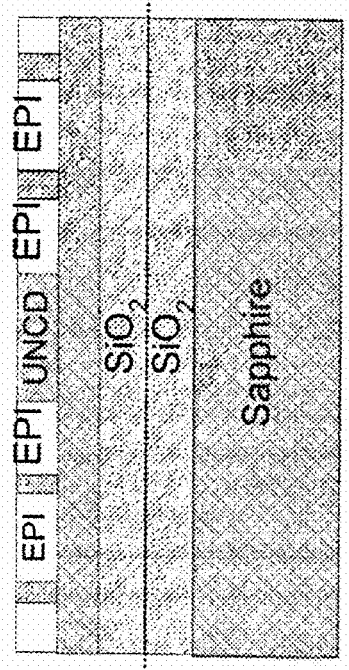
Figure 13c. Bonding between bonding layers (e.g. $SiO_2$)
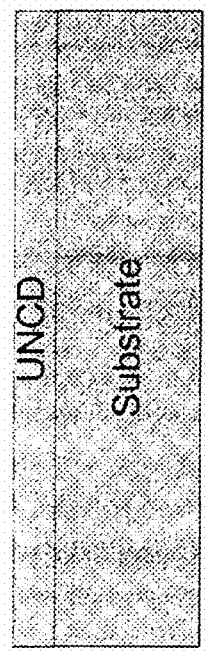
Figure 13d. Polish to form thin device layer
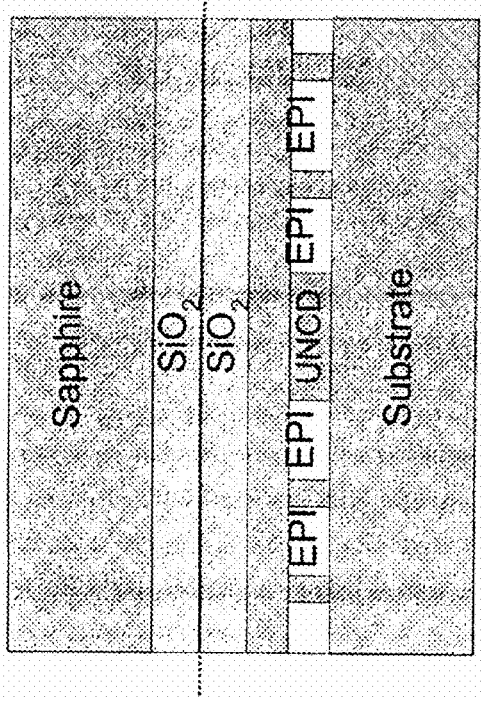

Figure 14. UNCD deposited on SOS on silicon substrates
Figure 14a. Starting SOS substrate (thicker Si)
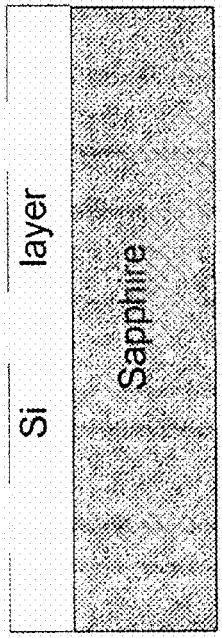
Figure 14b. Silicon patterning (partial etch)
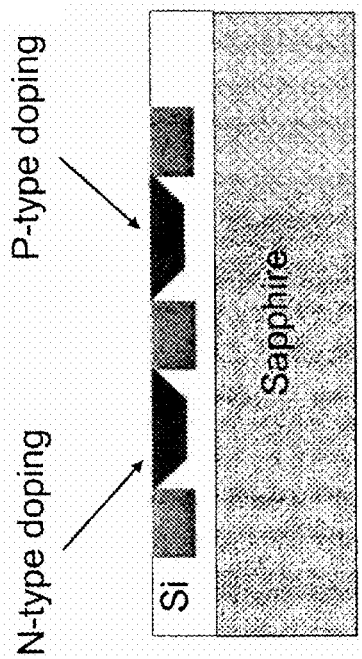
Figure 14c. Insulating UNCD deposition and planarization
Figure 14d. Device formation in Si layer
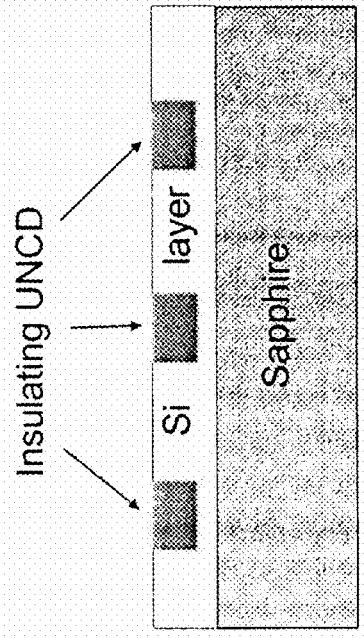

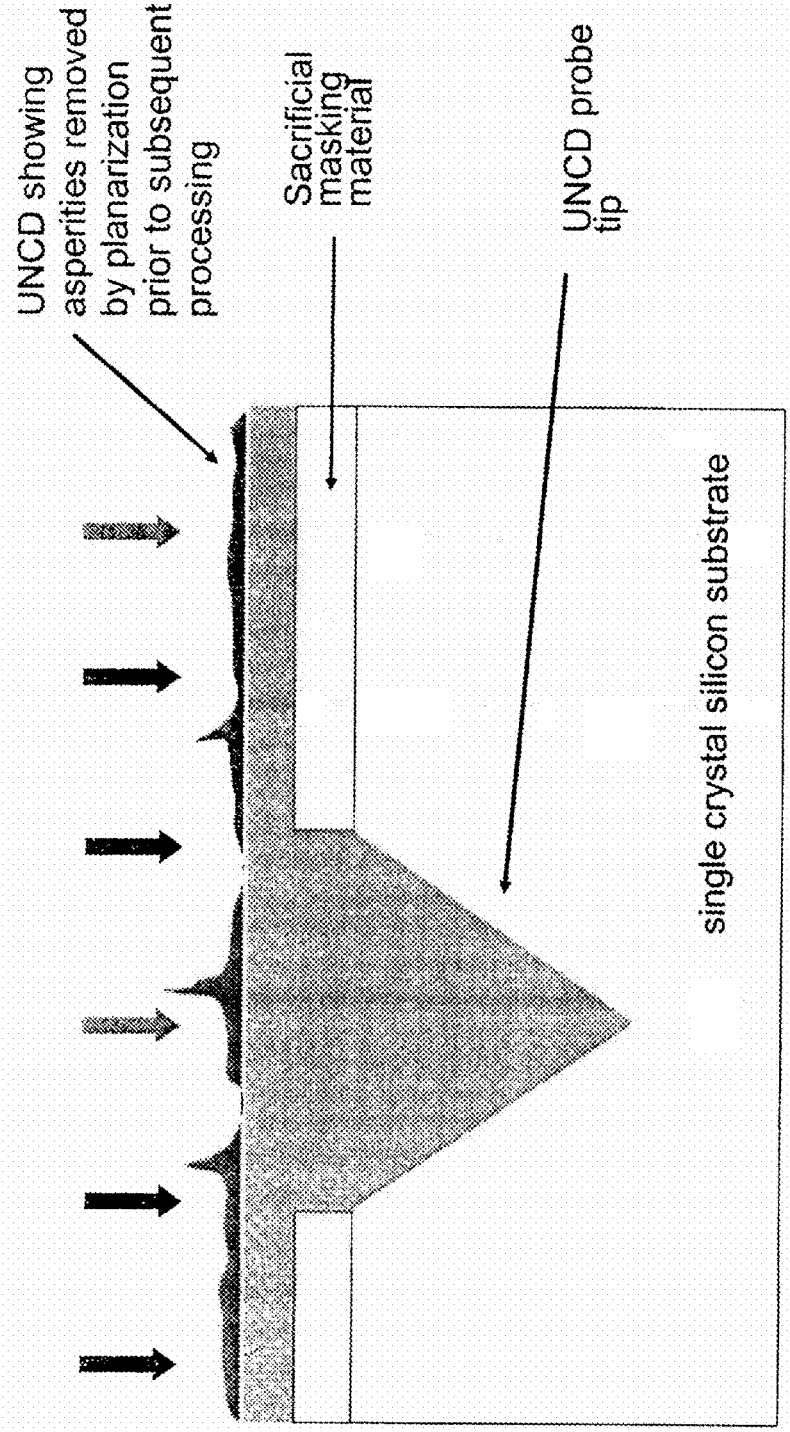

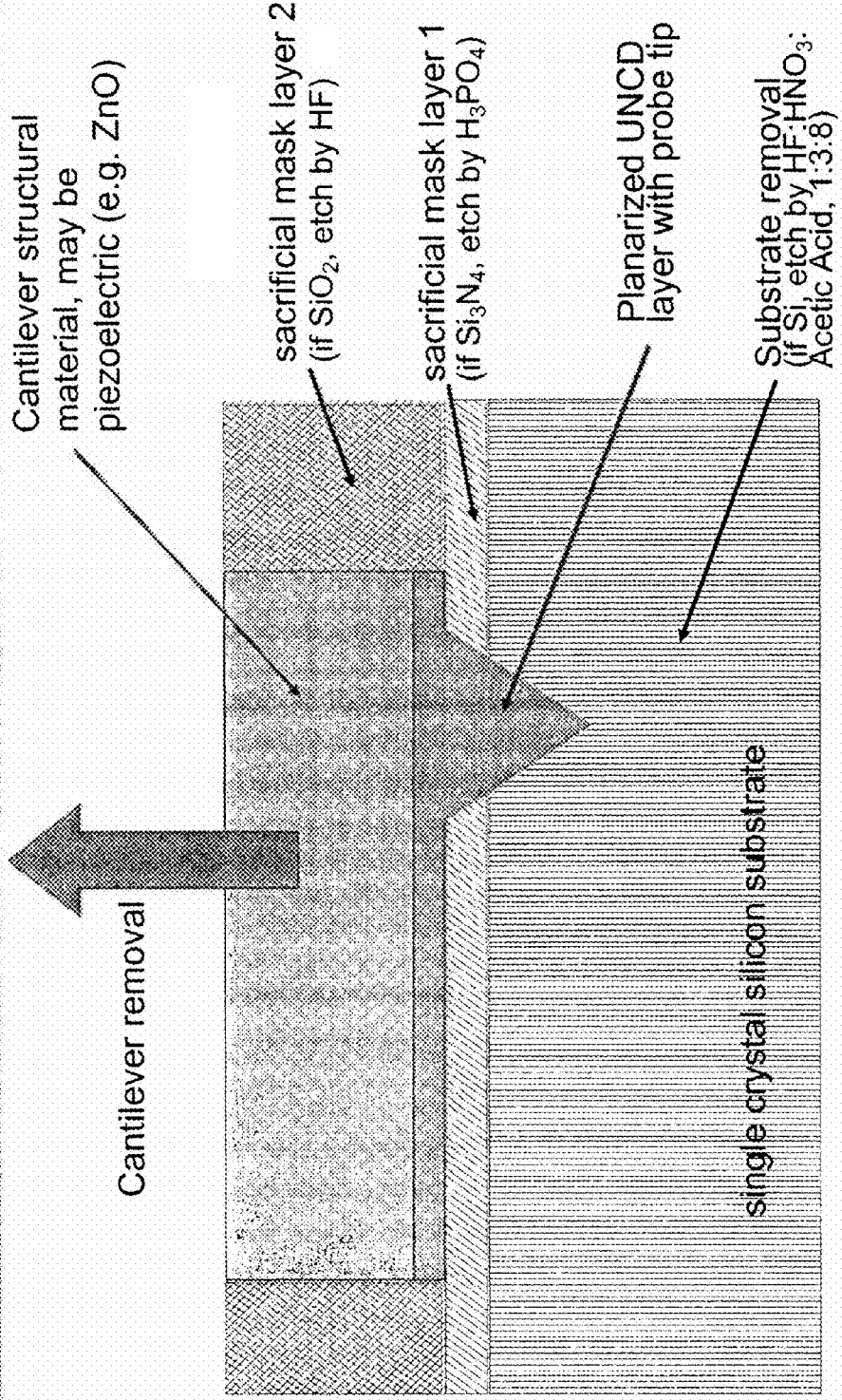

US 8,227,350 B2

CONTROLLING DIAMOND FILM SURFACES AND LAYERING

RELATED APPLICATIONS

This application claims priority to U.S. provisional application Ser. No. 61/019,175 filed Jan. 4, 2008, which is hereby incorporated by reference in its entirety.

BACKGROUND

Diamond is a vital natural carbon material and one of the three more common natural carbon allotropes in addition to amorphous carbon and graphite. Diamond has many excellent properties including, for example, mechanical hardness, low wear rates, chemical inertness, and thermal conductivity. Diamond also can be made synthetically by man. One way to make synthetic diamond is by chemical vapor deposition (CVD). In this process, gases containing carbon are converted to diamond and take the form of either particulates or a films (coatings), typically on a solid surface. The resulting diamond films are further typically classified by their crystalline structure. The first and dominate structural classification results from the film being either single-crystalline or polycrystalline. Polycrystalline diamond films are typically further classified by the resulting grain size, orientation, and grain boundaries features. Examples of the common classification of polycrystalline-films include microcrystalline diamond, nanocrystalline diamond (NCD), and ultrananocrystalline diamond (UNCD). In addition, the diamond may comprise some non-diamond carbon portions, and the percentage of the non-diamond portion can be varied. Still further, non-carbon atoms can be introduced to vary the properties. The specifics of the form, structure, and resulting properties of diamond can be dependent on the processing path and conditions. Hence, diamond is actually a family of materials, and these differences in the diamond structure can have important bearing on the application of diamond. See for example U.S. Pat. No. 5,989,511 (Argonne National Laboratory).

In some applications, the surface properties of diamond are important. For example, friction, wear, and other tribological properties can depend highly on surface metrology. In many cases, diamond having controlled surface is needed, but one may not have taken the time to evaluate precisely how the surface impacts properties. Diamond can be synthesized to have a smooth surface as made. Alternatively, diamond surface can be made more smooth by polishing. However, diamond is nature's hardest material, and polishing processes that make a diamond surface smooth can be economically costly and inefficient. Hence, a need exists to develop better, more controlled diamond surfaces and processes for making same. In particular, better tribological properties and lower sliding friction are needed. In many cases, a need exists to understand more fully the detailed relationship between diamond surface metrology and the application.

In addition, in many cases, large-scale methods of making diamond are needed which also control the surface properties. Processes useful in research may not be applicable for industrial applications. Cost efficient processes are needed.

In other applications, a need exists to deposit solid layers onto diamond.

U.S. Pat. No. 5,702,586 describes one process for polishing diamond.

SUMMARY

This application describes a series of embodiments including, for example, articles, devices, methods of making, methods of using, and compositions.

One embodiment provides: a method comprising: (i) providing at least one first diamond film comprising polycrystalline diamond, such as for example nanocrystalline or ultrananocrystalline diamond, disposed on a substrate, wherein the first diamond film comprises a surface comprising diamond asperities and having a first diamond film thickness; (ii) removing asperities from the first diamond film to form a second diamond film having a second diamond film thickness, wherein the second thickness is either substantially the same as the first thickness, or the second thickness is about 100 nm or less thinner than the first diamond film thickness; (iii) optionally patterning the second diamond film to expose substrate regions and, optionally, depositing semiconductor material on the exposed substrate regions; (iv) depositing a solid layer on the optionally patterned second diamond film to form a first layered structure.

Another embodiment provides a method comprising: providing at least one first diamond film comprising polycrystalline diamond disposed on a substrate, wherein the first diamond film comprises a surface with an unpolished average roughness of less than 50 nm and having a first diamond film thickness; processing the first diamond film to form a second diamond film having a second diamond film thickness, wherein the second thickness is either substantially the same as the first thickness, or the second thickness is about 100 nm or less thinner than the first diamond film thickness and the surface roughness is less than 10 nm; optionally patterning the second diamond film to expose substrate regions and, optionally, depositing semiconductor material on the exposed substrate regions; and depositing a solid layer.

Another embodiment provides a method comprising: fabricating at least one semiconductor device comprising device elements in a semiconductor device layer and a substrate, wherein the fabrication comprises at least one step comprising forming a polycrystalline diamond film, e.g., nanocrystalline or ultrananocrystalline diamond film, which is adapted for electrically insulating device elements from the substrate and also adapted for providing thermal conductivity pathways between device elements and the substrate, wherein the diamond film as formed comprises asperities which are subjected to an asperity removal step.

Another embodiment provides a method comprising: fabricating at least one semiconductor device comprising device elements in a semiconductor device layer and a substrate, wherein the fabrication comprises at least one step comprising forming a polycrystalline diamond film which is adapted for electrically insulating device elements from the substrate and also adapted for providing thermal conductivity pathways between device elements and the substrate, wherein the diamond film as formed has an Ra of about 20 nm or less and has a first thickness, and is subjected to a diamond removal step which comprises removing about 25 nm or less of diamond from the first thickness.

Another embodiment provides a method comprising: providing at least one first diamond film comprising diamond disposed on a substrate, wherein the first diamond film comprises a surface comprising diamond asperities and having a first diamond film thickness, removing asperities from the first diamond film to form a second diamond film having a second diamond film thickness, wherein the second thickness is either substantially the same as the first thickness, or the second thickness is about 100 nm or less thinner than the first diamond film thickness, and wherein the second diamond film has an average grain size of about 20 nm or less and an average surface roughness of about 50 nm or less, depositing a solid layer on the second diamond film to form a first layered structure.

Another embodiment provides a method comprising: providing at least one first diamond film comprising polycrystalline diamond disposed on a substrate, wherein the first diamond film comprises a surface comprising diamond asperities and having a first diamond film thickness, removing asperities from the first diamond film to form a second diamond film having a second diamond film thickness, wherein the second thickness is either substantially the same as the first thickness, or the second thickness is about 100 nm or less thinner than the first diamond film thickness, depositing a solid layer on the second diamond film, wherein the material of the solid layer is selected to be adapted for direct bonding to another layer of the same material.

Another embodiment provides a method comprising: providing at least one first diamond film comprising polycrystalline diamond disposed on a substrate, wherein the first diamond film comprises a surface comprising diamond asperities and having a first diamond film thickness, removing asperities from the first diamond film to form a second diamond film having a second diamond film thickness, wherein the second thickness is either substantially the same as the first thickness, or the second thickness is about 100 nm or less thinner than the first diamond film thickness, patterning the second diamond film to expose substrate regions and depositing semiconductor material on the exposed substrate regions, depositing an additional third layer of polycrystalline diamond on the first diamond film and semiconductor material, depositing a solid layer on the third diamond film.

Another embodiment provides a method comprising: fabricating a cantilever, wherein the cantilever fabrication comprises depositing diamond film comprising polycrystalline diamond, e.g., nanocrystalline or ultrananocrystalline diamond, and comprising a surface comprising asperities, and removing asperities from the surface.

Another embodiment provides a device comprising: a plurality of semiconducting device elements and an insulating substrate, wherein the device elements are dielectrically isolated by one or more layers which comprise at least one layer of polycrystalline diamond, e.g., NCD or UNCD.

Another embodiment provides a device comprising: at least one substrate, at least one layer of polycrystalline diamond, e.g., NCD or UNCD diamond, disposed on the substrate, at least two bonding layers bonded together, one first bonding layer disposed on the NCD or UNCD layer, and one second bonding layer disposed on and bonded to the first bonding layer, at least one semiconductor device layer disposed on the second bonding layer.

Another embodiment provides a device comprising: at least one substrate, at least two bonding layers bonded together, one first bonding layer disposed on the substrate, and one second bonding layer disposed on and bonded to the first bonding layer, at least one layer of polycrystalline diamond, e.g., NCD or UNCD, disposed on the second bonding layer, at least one semiconductor device layer disposed on the polycrystalline diamond, e.g., NCD or UNCD, layer.

Another embodiment provides an article comprising at least one cantilever, wherein the cantilever comprises a diamond film comprising polycrystalline diamond, e.g., nanocrystalline or ultrananocrystalline diamond, and comprising a surface disposed next to a solid layer which is substantially free of asperities.

An exemplary advantage for at least one embodiment is improved heat flow in a device architecture which produces heat. This is particularly important as devices are made smaller including nanoscale.

Another example of an advantage for at least one embodiment is reduced defects in a device architecture.

BRIEF DESCRIPTION OF FIGURES

FIG. 6 is a graph of the roughness of 9 seals, in their original form (SiC surface), after UNCD diamond deposition and after a 90 second diamond slurry polish FIG. 7 is a graph of the asperity count (asperity defined as heights greater than 100 nm above the average height) of 6 seals, in their original as-received form (SiC surface), after UNCD diamond deposition and after a 90 second diamond slurry polish.

FIGS. 8a-8d are schematic diagrams of diamond as an additional dielectric for a dielectric insulator. In FIG. 8, although the Figure indicates UNCD, NCD can be also used.

FIGS. 9a-9d are schematic diagrams of diamond as an additional dielectric for a dielectric insulator and as polish stop for the device layer CMP. In FIG. 9, although the Figure indicates UNCD, NCD can be also used.

FIGS. 10a-10d are schematic diagrams of diamond as an additional dielectric for a dielectric insulator and the use of Cu as a bonding layer. In FIG. 10, although the Figure indicates UNCD, NCD can be also used.

FIGS. 11a-11c are schematic diagrams of diamond as a semiconductor layer for integrated circuits on a sapphire substrate. In FIG. 11, although the Figure indicates UNCD, NCD can be also used.

FIGS. 12a-12d are schematic diagrams of diamond as an additional dielectric for DI with sapphire substrates. In FIG. 12, although the Figure indicates UNCD, NCD can be also used.

FIG. 13a-13d are schematic diagrams of diamond as an additional dielectric for a dielectric insulator and as polish stop for the device layer CMP on sapphire. In FIG. 13, although the Figure indicates UNCD, NCD can be also used.

FIG. 14a-14d are schematic diagrams of diamond deposited on SOS on silicon substrates. In FIG. 14, although the Figure indicates UNCD, NCD can be also used.

FIG. 15a-15b are schematic diagrams of the integration of planarized diamond into MEMS cantilever process flow (with integrated probe tip). In FIG. 15, although the Figure indicates UNCD, NCD can be also used.

DETAILED DESCRIPTION

Introduction and Diamond Deposition

Figure 1:
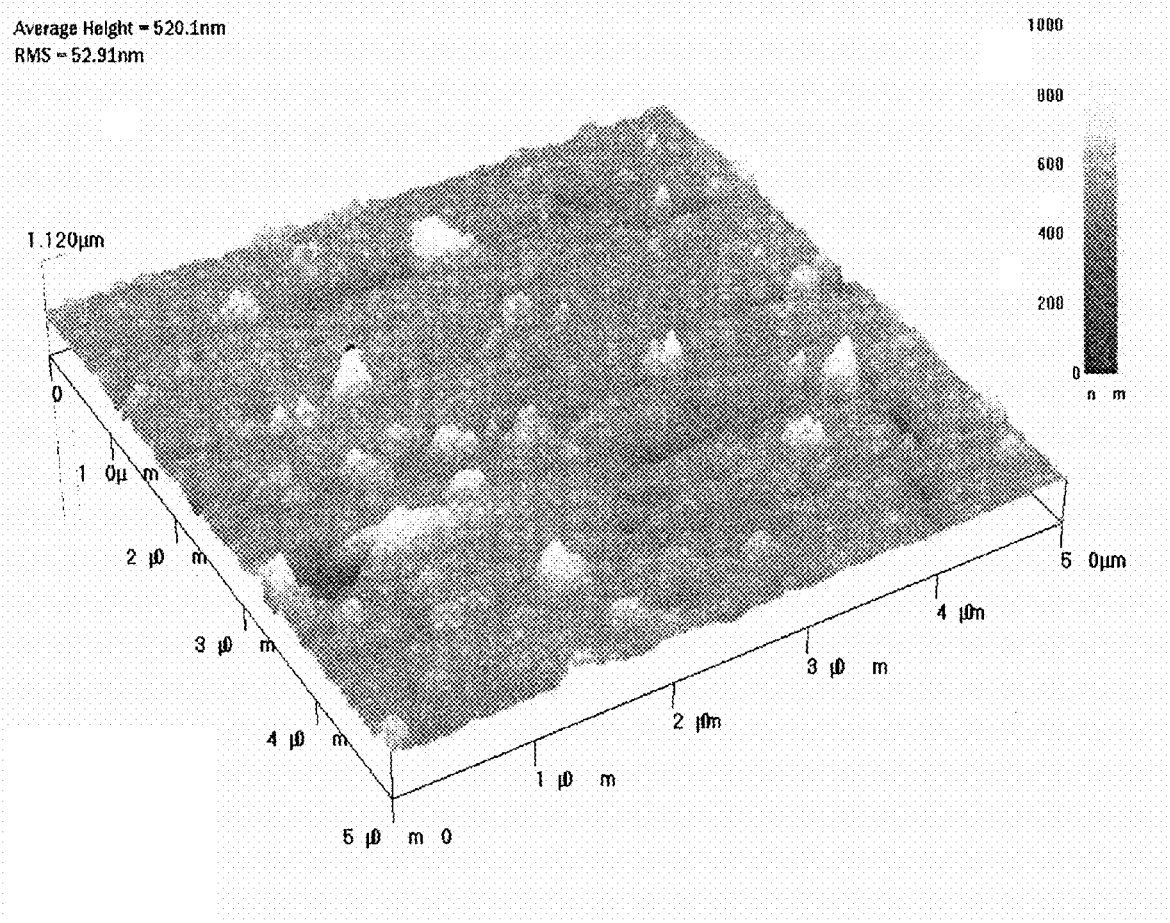
FIG. 1 is a representative 50×50 μm Atomic Force Microscopy (AFM) topographical map of an "as-deposited" UNCD film showing relatively narrow asperities of greater than 100 nm in height

Priority U.S. provisional application Ser. No. 61/019,175 filed Jan. 4, 2008 is hereby incorporated by reference in its entirety including all sections including, for example, figures, examples, and claims.

Also, U.S. provisional application Ser. No. 61/019,165 filed Jan. 4, 2008 is hereby incorporated by reference in its entirety including all sections including, for example, figures, examples, and claims.

Co-pending application Ser. No. 12/319,229 to C. West et al. ("Controlling Diamond Film Surfaces") filed on same day, Jan. 2, 2009, is hereby incorporated by reference in its entirety.

References cited herein are hereby incorporated by reference in their entirety. The following references, and other references cited herein, can be used as needed in practice of the various embodiments described herein, including the making of diamond including polycrystalline diamond, including for example nanocrystalline and ultrananocrystalline diamond.

Semiconductor fabrication is described in, for example, *Microchip Fabrication*, 5$^{th}$ Ed. P. Van Zant, 2004 including for example SOS and SOI applications and insulators (e.g., pages 394-399).

Microfabrication is described in, for example, *Fundamentals of Microfabrication, The Science of Miniaturization*, 2$^{nd}$ Ed., M. Madou, including for example bonding processes and SOI applications (pages 484-493)

Diamond can be made and deposited onto substrates by CVD methods. See for example U.S. Pat. Nos. 4,434,188; 5,204,145; and 5,523,121.

Diamond synthesis and characterization are also described in for example Gruen et al. (Eds.), *Synthesis, Properties and Applications of Ultrananocrystalline Diamond*, 2005.

Gruen, "Nanocrystalline Diamond Films," *Annu. Rev. Mater. Sci.*, 29 (1999) 211.

May et al. "Reevaluation of the mechanism for ultrananocrystalline diamond deposition from Ar/CH4/H2 gas mixtures", *Journal of Applied Physics*, 99, 104907 (2006);

May et al. "Experiment and modeling of the deposition of ultrananocrystalline diamond films using hot filament chemical vapor deposition and Ar/CH4/H2 gas mixtures: A generalized mechanism for ultrananocrystalline diamond growth." *J Applied Phys.*, 100, 024301 (2006).

May et al. "Microcrystalline, nanocrystalline and ultrananocrystalline diamond chemical vapor deposition: Experiment and modeling of the factors controlling growth rate, nucleation and crystal size", *Journal of Applied Physics*, 101, 053115 (2007);

Wang et al., "The fabrication of nanocrystalline diamond films using hot filament CVD", *Diamond Relat. Mater.*, 13-1, 6-13 (2004);

Xiao et al., "Low Temperature Growth of Ultrananocrystalline Diamond", *Journal of Applied Physics*, 96, 2232 (2004);

Carlisle et al., "Characterization of nanocrystalline diamond films by core-level photoabsorption", *Appl. Phys. Lett.* 68, 1640 (1996);

Schwarz, et al., "Dependence of the growth rate, quality, and morphology of diamond coatings on the pressure during the CVD-process in an industrial hot-filament plant", *Diamond Rel. Materials.*, 11, 589 (2002);

James Birrell et al., Morphology and Electronic Structure of Nitrogen-doped Ultrananocrystalline Diamond *Appl. Phys. Lett.* 81, 2235 (2002);

Birrell et al., *Interpretation of the Raman Spectra of Ultrananocrystalline Diamond*, Diamond & Relat. Mater. 14, 86 (2005);

Carlisle et al., *Chemical Physics Letters*, v. 430, iss. 4-6, p. 345-350;

The diamond can be made by methods known in the art. See for example U.S. Pat. Nos. 5,989,511; 6,592,839; 5,849,079; 5,772,760; 5,614,258; 5,462,776; 5,370,855; 5,328,676; 5,209,916, and US Patent Publication Nos. 2005/0031785; 2005/0042161; 2006/0131588; 2006/0222850 (Carlisle et al.).

In particular, US Patent Publication 2005/0042161 describes phase pure ultrananocrystalline diamond and diamond compositions described herein can consist essentially of ultrananocrystalline diamond or nanocrystalline diamond.

U.S. patent application Ser. No. 11/775,846 filed Jul. 10, 2007 to Carlisle et al. describes methods of making diamond film including by hot filament methods.

U.S. Provisional application Ser. No. 60/928,808 filed Jul. 13, 2007 describes making scanning probe and atomic force microscope probes including use of diamond deposition and tungsten seeding.

Substrate

The substrate material, and the surface thereof, can be for example a hard material or ultrahard material used in bearings, load bearing surfaces, abrasives, and (mechanical) seals such as, for example, a ceramic or an engineering ceramic such as for example silicon carbide (SiC), silicon nitride, cubic boron nitride (CBN), tungsten carbide (WC), WC with various binders, other solid solutions of metals and ceramics, metals, or metal alloys including steels, metal-matrix composites, and ceramic metal composites. Hard substrates, including silicon carbide, are described in for example U.S. Pat. Nos. 5,834,094; 5,952,080; 6,002,100; and 6,046,430. SiC can be used in a variety of forms and structures including alpha, beta, liquid impregnated, whisker reinforced, and in composites including for example SiC/C (see for example U.S. Pat. No. 6,355,206). The substrate material can be a seal, such as a pump seal, and the face of the seal can be oriented as needed for diamond deposition.

Other substrates include for example silicon, silicon dioxide, tungsten, molybdenum, copper, platinum, carbides, nitrides, oxides and other materials onto which diamond can be deposited.

Before the diamond deposition, the substrate can be characterized by an asperity density such as for example about 3 to about 35 per square mm, or about 5 to 25 per square mm, or about 5 to about 20 per square mm. These values can be measured directly using an atomic force microscope (AFM), scanning electron microscope (SEM), or an optical or stylus-based profilometry. If a linear profilometry is used, then the asperity count per unit length can be extrapolated into an asperity per unit area by correcting for the contact (if stylus) or inspection (if optical) width being used. The asperities can be those protrusions that have a height greater than about 100 nm above the average height.

In addition, before diamond deposition, the substrate can be characterized by an average roughness (Ra) of about 1 nm to about 25 µm, or about 2 µm to about 20 nm, or about 2 µm to about 15 nm.

Asperities

A particular aspect of surface roughness is the presence of asperities. Asperities can arise from a variety of sources including for example imperfections in the substrate or initial surface, non-uniform distribution or clumps of seed diamonds on the initial surface, and/or non-uniformities in processing conditions during diamond deposition. Asperities can be protrusions which are greater than about three times the average roughness of the surface above the average height of the film. For example, they can be about 3 times to about 20 times, or about 5 times to about 20 times. Asperities can be slender in appearance and can have example height/width (H/W) aspect ratio of greater than 1:1. The H/W ratio can be for example about 2 to about 10. Examples of asperities are shown in FIG. 1.

Removing Diamond Asperities

The asperity removal steps can be carried out by methods known in the art including for example use of an abrasive surface such as a slurry in a polishing action, use of a plasma like an oxygen-containing plasma, isotropic etching including use of plasma or wet chemistry, and ablation including laser ablation, and other methods. Etching processes are generally known as described in for example Madou, *Fundamentals of Microfabrication, The Science of Miniaturization*, 2$^{nd}$ Ed. 2002.

The removal step can be carried out for relatively short periods of time such as for example about 60 minutes or less, or about 30 minutes or less, or about 2 minutes to about 10 minutes. One can adapt the removal time for a particular application, the cost-benefit of additional time, and need for commercial efficiency.

In the polishing action with abrasive surface, a short polishing time can be used such as for example about 60 minutes or less, or about 45 minutes or less, or about 30 minutes or less, or about 10 minutes or less, or about one minute to about 10 minutes. A relatively low down force can be used such as for example about 3 psi or less or about 2 psi or less. A variety of abrasive surfaces can be used. For example, small, hard abrasive particles can be used. Examples of hard particles include diamond including nanodiamond, silicon carbide, alumina including alpha-alumina, or zirconia, and other ceramics. A fixed abrasive film can be used including those with small features. A slurry can be used both to transport abrasive particles uniformly across the film surface and also to remove debris, including asperity debris, from the surface once the asperities are removed from the underlying film.

In another method of asperity removal, isotropic etching in either a plasma or wet chemistry can be carried out. In one embodiment, an oxygen-containing plasma can be used. The removal step can comprise exposure to oxygen-containing plasma for about 60 minutes or less. Oxygen-containing plasmas are generally known in the art including use with diamond. See for example U.S. Pat. Nos. 6,348,240 (Calvert) and 5,711,698 (Chakraborty) and 6,652,763 (Wei). Other isotropic etching includes for example plasma etch containing both fluorine and oxygen atoms ($SF_6/O_2$).

In another method for asperity removal, an ablation including a laser ablation step can be carried out. See for example U.S. Pat. Nos. 4,987,007 (Wagal) and 5,747,120 (McClean). Laser pulses can be used with a pulse duration of for example about 10 ns to about 50 ns, or about 20 ns to about 50 ns, a total pulse energy of about 0.0002 J/pulse to about 0.1 J/pulse, and less than about $10^{10}$ W/cm$^2$ or less than about $10^6$ W/cm$^2$ or less than about $10^5$ W/cm$^2$ of irradiance on the surface of the material.

In some cases, the step of removing the diamond asperities can be carried out in the same instrument which was used for forming the diamond. For example, equipment used in the semiconductor industry can be used or adapted including multi-chamber instruments which have the same platform for the different chambers such as same pump set.

In one embodiment, the removal step does not involve ion implantation, and does not involve electrochemical etching, as described in for example U.S. Pat. No. 5,702,586, and removal can be carried out without these steps.

Diamond Parameters Before Asperity Removal

The diamond film can possess a first film thickness measured before asperity removal. For example, this first thickness can be for example about 100 nm to about 10 microns, or about 500 nm to about 5 microns, or about one micron to about 3 microns. Film thickness can be measured by for example ellipsometry.

The diamond film can be a polycrystalline diamond film and can comprise crystalline diamond including nanocrystalline diamond or ultrananocrystalline diamond.

For example, the diamond film can be characterized by an average grain size of about 2,000 nm or less, or about 1,000 nm or less, or about 100 nm or less, or about 50 nm or less, or about 20 nm or less, or about 10 nm or less. A lower limit can be for example 1 nm or 2 nm or 3 nm. Average grain size can be measured by TEM analysis including HRTEM analysis, or alternatively x-ray diffraction.

The diamond film can provide an asperity density of at least about 1,000/mm$^2$, or at least about 4,000/mm$^2$ including, for example, about 4,000/mm$^2$ to about 20,000/mm$^2$. On a linear basis, the film typically can have a linear asperity density of at least about 8/mm, e.g., about 8/mm to about 40/mm, prior to asperity removal, as determined by profilometry with a two micron diameter stylus tip. In other embodiments, asperity density can be, for example, at least about 20 per square cm or about 20 per square cm to about 50 per square cm. Asperity density can be measured by AFM and other profilometry analysis.

The asperity can have a height/width ratio of at least about 1:1, or at least about 2:1, or at least about 3:1. This ratio can be measured by AFM analysis.

The asperity can have a height per Ra of greater than about three, or greater than about 10. This can be measured by AFM analysis.

The diamond surface can have an average surface roughness of about 50 nm or less, or about 20 nm or less. In one embodiment, the Ra can be, for example, about 20 nm or less. This can be measured by AFM or profilometry.

The diamond surface can also comprise surface depressions which can be measured by AFM and other profilometry analysis. The depression can comprise a percentage of the surface. The depth of the depressions can be for example about 1% to about 30% of the surface, or about 1% to about 20% of the surface, or about 2% to about 10% of the surface. The shape of the depressions can be, for example, a variety of random shapes. The shape can be non-conical.

After asperity removal, the diamond surface can be further treated to for example remove debris.

Diamond Parameters after Asperity Removal

After asperity removal, some diamond parameters will be substantially the same as before removal (for example, average grain size). Other parameters can be affected by the asperity removal (for example, the thickness or asperity density).

The diamond film can now, after asperity removal, be characterized by a second film thickness. This second thickness can be similar to the first thickness. For example, film thickness may be reduced about 10% or less, or about 5% or less, or about 2% or less, or about 1% or less. Film thickness can be measured by ellipsometry.

The difference between the first film thickness, before removal, and the second film thickness, after removal, can be for example about 500 nm or less, or about 200 nm or less, or about 100 nm or less, or about 50 nm or less, or about 25 nm or less, or about 10 nm or less, or the first and second film thicknesses can be about the same. The second thickness can be about 100 nm or less thinner than the first thickness. Film thickness is optionally reduced as the reduction in thickness may be smaller than can be measured experimentally. In many cases, asperity removal results in a reduction in film thickness.

The asperity density can now be, for example, less than about 2,000 per square mm, or less than about 500 per square mm, or less than about 300 per square mm, or less than about 10 per square mm, or less than about 5 per square mm, or less than about 3 per square mm. On a linear basis, the film preferably exhibits an asperity density of not more than about 4/mm after asperity removal, as determined by profilometry using a stylus having a tip diameter of two microns.

The surface roughness average (Ra) can be, after removal, about 50 nm or less, or about 20 nm or less.

The average grain size can be, after removal, about 20 nm or less, or about 10 nm or less.

The coefficient of sliding friction (SiC) can be, after removal, less than about 0.1. This can be measured by methods known in the art. See for example U.S. Pat. No. 5,989,511.

After removal, the planarized diamond film can have fewer than about 10 asperities per square centimeter, wherein the asperities have a height/width ratio of greater than about 1:1 and a height above the average height of the surface of the film greater than about three times the average surface roughness. Or, after removal, the planarized diamond film can have fewer than about 10 asperities per square centimeter, wherein the asperities have a height/width ratio of greater than about 1:1 and a height above the average height of the surface of the film greater than about ten times the average surface roughness.

After removal, the planarized diamond film can have a surface comprising depressions wherein about 1% to about 30% of the surface, or about 15% to about 25%, or about 1% to about 20% of the surface, is depressed by more than about 25 nm compared to the average height of the surface. In some cases, these depressions are substantially similar to those present before the removal step.

Patterning

If desired, the second diamond film can be subjected to patterning. Patterning can be done at the microscale or nanoscale using known patterning methods. The patterning can expose substrate regions. Material can be deposited into the exposed substrate regions including, for example, a semiconductor material. For example, epitaxial silicon can be deposited. The deposited material can be subjected to smoothing and planarization processes.

Alternatively, the first diamond film can be patterned and then subjected to polishing to form the second diamond film.

Solid Layer

A solid layer can be deposited on the second diamond film to form a first layered structure. The nature of the solid layer, including deposition method, chemical identity, morphology, thickness, and the like, can be adapted for an application.

For example, the solid layer can comprise an electrical insulator, an electrical conductor, or a semiconductor. The solid layer can comprise an oxide such as, for example, a metal oxide or an inorganic oxide such as for example aluminum oxide or silicon dioxide. The solid layer can comprise a metal such as, for example, elemental metallic conductors like copper, gold, or silver. The solid layer can comprise additional nanocrystalline or ultrananocrystalline diamond.

The solid layer can be, for example, a material that can be adapted for an additional bonding step or process.

Integrated Circuit Devices

Nanocrystalline diamond and UNCD which is processed as described herein can be an excellent material for use in dielectrically isolated semiconductor devices, such as transistors, capacitors, and integrated circuits. In particular, silicon-on-insulator (SOI) and silicon-on-sapphire (SOS) technologies can be adapted to include the diamond and the diamond processing described herein.

A planarized nanocrystalline or UNCD layer prior to $SiO_2$ bonding layer deposition may be used for a dielectric isolation—silicon-on-insulator (DI-SOI) process. A layer such as a bonding layer, or a silicon dioxide layer, can be disposed next to a diamond layer, and the relative thicknesses of the two layers can be adapted for an application. A reduction in the thickness of the $SiO_2$ bonding layer with a corresponding increase in the thickness of the diamond layer leads to improvements in the thermal performance of the resulting composite dielectric layer because of the resulting increase in the average thermal conductivity of the layer. A limit on the minimum thickness of the $SiO_2$ layer is the roughness and the capability of bonding of the underlying diamond layer. The presence of asperities of a height greater than the layer thickness of the deposited bonding layer material, could either produce roughness in a deposited $SiO_2$ layer or even interfere directly with the bonding process by preventing mechanical contact between the opposing $SiO_2$ bonding layers during wafer bonding. The presence of protruding asperities of diamond (see FIG. 1) could also render ineffective bonding layer planarization methods, such as CMP, that might be contemplated to planarize the bonding layer surface after deposition. The mechanical hardness and chemical inertness of diamond as compared to the relative softness of $SiO_2$, would present a difficult or impractical planarization scenario because those abrasives which might be capable of abrading diamond (e.g. diamond, SiC, or alpha-alumina, and the like) would tend to scratch and roughen $SiO_2$. Those abrasives that might be appropriate for $SiO_2$, such as $SiO_2$, aluminas other than alpha, and the like) would probably not abrade diamond to a sufficient degree and therefore might actually increase the overall roughness of the surface. Therefore, planarization of the nanocrystalline diamond or UNCD prior to $SiO_2$ deposition according to the inventive methods discussed above is a preferred approach for the application of nanocrystalline diamond or UNCD to SOI.

FIGS. 8-15 describe additional exemplary embodiments. Variations in these exemplary embodiments can be carried out.

FIG. 5

FIGS. 5a-5d illustrate an exemplary method by which a nanocrystalline diamond or UNCD layer may be integrated into a silicon-on-insulator (SOT) integrated circuit (IC).

FIG. 5a depicts schematically a diamond layer deposition followed by planarization to remove asperities. Semiconductor grade silicon (Si) substrate material can be used with diamond particularly because of the chemical compatibility of silicon and diamond. However, other substrate semiconductor materials may also be used, such as for example GaAs, InP, SiC, SiGe, and other like semiconductor substrates. Typical thicknesses for diamond layer in this application may vary between, for example, about 200 nm and about 4 μm in thickness. The diamond layer in FIG. 5a can be subjected to asperity removal as described herein (not shown).

FIG. 5b shows a solid layer deposition or bonding layer deposition for the composite dielectric stack illustrated in FIG. 5a. Silicon dioxide ($SiO_2$) may be used as a preferred bonding material. Some of the reasons why $SiO_2$ is preferred include the maturity and consistency of silicon dioxide processing methods, its chemical compatibility with the preferred substrate material (Si), its excellent dielectric properties, such as high breakdown voltages and low inter facial fixed charge, the relative maturity of CMP planarization methods for $SiO_2$, and the strong bonds formed between planarized $SiO_2$ surfaces at low temperatures during dielectric bonding. However, other bonding layer materials may be considered. For example, copper (Cu) is a good choice as a bonding material but requires a higher bonding temperature (200-400° C.) than $SiO_2$ but Cu is an excellent electrical and thermal conductor and therefore would not electrically isolate transistors when used by itself. However, when used in conjunction with diamond, which can serve as an excellent electrical insulator for semiconductor devices, Cu may be an excellent choice for a bonding material. A diamond layer may underly and isolate the transistors and as a material with very high thermal conductivity, it would conduct heat away from the transistors and help to maintain isothermal conditions throughout the integrated circuit.

FIG. 5c shows the bonding of two partially processed SOI wafers. The upper wafer comprises a semiconductor substrate and a bonding layer of $SiO_2$. The lower wafer is that shown in FIG. 5b. However, in an alternative embodiment, an additional layer of diamond could be added between the $SiO_2$ layer and the semiconductor substrate of the upper wafer. An aspect of using a UNCD layer in the place of $SiO_2$ as the bulk insulator formed between the semiconductor device layer and the substrate, is an overall improvement in the thermal conductivity of the dielectric layer. A layer of diamond, and in particular UNCD, possesses orders of magnitude better thermal conductivity than $SiO_2$. For example, the thermal conductivity of UNCD is between about 200 W/m° K. and about 2000 W/m° K. for UNCD at about 20° C., compared with that of $SiO_2$ of about 1.3 W/m° K. and 386 W/m° K. for Cu.

An additional step in the preparation of a DI-SOI wafer is the thinning and planarization of the semiconductor layer as shown in FIG. 5d. The top substrate material is usually thinned by, for example, a combination of mechanical grinding and/or lapping followed by CMP to produce a smooth device surface ready for further integrated circuit fabrication steps.

Figure 5:
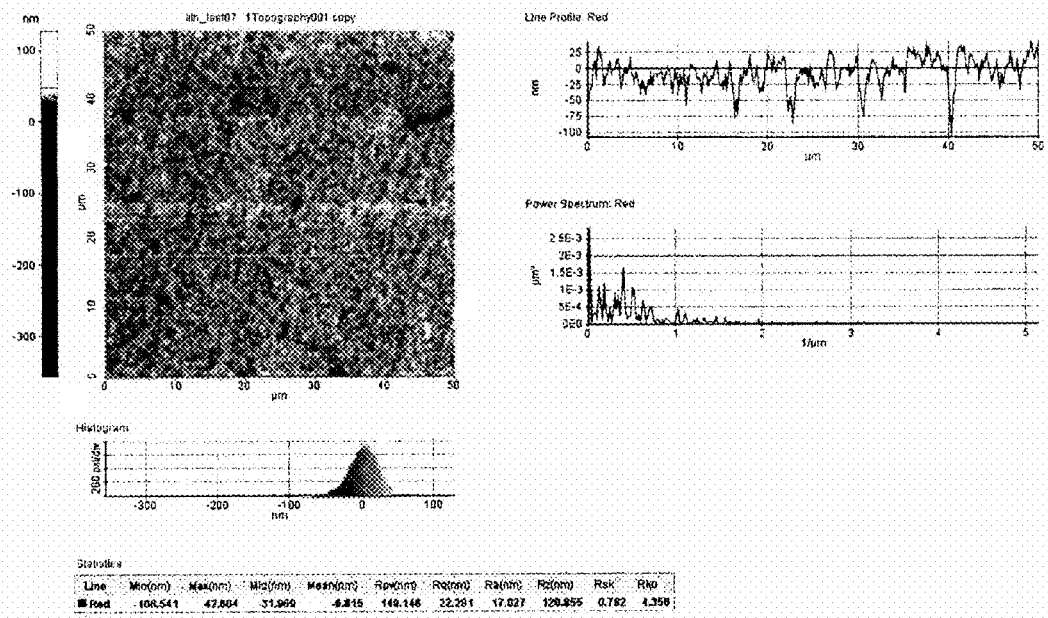
FIG. 5 shows AFM data illustrating from a top view the surface after planarizing including a histogram of the surface roughness.

In FIG. 5, the diamond layer, which is subjected to asperity removal, is not in direct contact with the device layer. Rather, the diamond layer is disposed between a substrate and an insulator layer.

FIG. 6

The DI-SOI fabrication steps shown in FIGS. 6a-6d are similar to those shown in FIGS. 5a-5d except that the resulting composite dielectric now uses nanocrystalline diamond or UNCD as the layer directly underlying and in thermal contact with the semiconductor device layer. Moreover, the diamond layer is patterned before or after asperity removal.

FIG. 6a shows the deposition of the nanocrystalline or UNCD layer on a substrate with a diamond thickness, for example, between about 30 nm and about 300 nm. At least some of the asperities can be removed before further processing.

FIG. 6b shows the patterning of the diamond layer using prior art IC patterning techniques, such as for example photolithography and oxygen plasma etching. Asperities can be removed. This can be followed by epitaxial growth of single crystal semiconductor material. Silicon epitaxy is the preferred technique for this step. The thickness of the semiconductor material is preferably thicker than the surrounding diamond thickness. The growth step is preferably followed by a planarization step to thin the semiconductor layer. A silicon CMP process is the preferred method to planarize the semiconductor layer using the surrounding diamond as a polish stop.

After the diamond layer is planarized, a further layer of nanocrystalline or UNCD can be deposited on top of the combined diamond/semiconductor layer as a solid layer. The planarization of the diamond layer as shown in FIG. 6a greatly improves the planarity of subsequent diamond deposition.

FIG. 6c also shows the deposition of another $SiO_2$ solid layer on top of the second diamond layer and subsequent bonding with a top wafer. The top wafer shown in FIG. 6c can be a substrate wafer coated with a single layer of $SiO_2$, however, alternative composite dielectric stacks are also possible, including another layer of nanocrystalline diamond or UNCD underlying the $SiO_2$ bonding layer.

FIG. 6d illustrates the form of the DI-SOI wafer after removal of the substrate material. This can be typically accomplished using diamond lapping and then silicon CMP to form a final smooth surface. The CMP process that can be used to thin the device layer would have a large process margin because of the hardness and chemical inertness of the diamond surrounding the islands of epitaxially grown semiconductor material. In addition, the control of the thickness of the semiconductor device layer is superior to prior art DI processes. The only significant variable in this thickness is the variation in thickness of the diamond as deposited. Another preferred embodiment of the invention is the use of diamond to form regions of isolation between transistors in the place of other prior art device isolation techniques such as shallow trench isolation. The regions of UNCD between islands of epitaxially grown (epi) semiconductor material shown in FIG. 6d are illustrative of this concept. The process flow shown in FIG. 6a to 6d is reminiscent of other semiconductor processing methods to form dielectrically isolated IC devices. However, the advantages provided by the inventive method and the use of a dielectric with greater thermal conductivity than silicon and excellent resistance to the polishing abrasives and chemicals used for silicon CMP, are substantial improvements.

FIG. 7

The use of a metal such as for example, copper, as bonding material in the place of $SiO_2$ is shown in FIGS. 7a-7d. The process steps shown in FIGS. 7a-7d are similar to those shown in FIGS. 6a-6d, apart from use of copper. The use of Cu in the place of $SiO_2$ effectively eliminates the thermal impedance issues associated with that dielectric while the UNCD layer in place between the device layer and the underlying Cu layer effectively provides electrical isolation for the transistors and other IC devices.

The copper can be deposited by methods known in the art.

Silicon-on-Sapphire (SOS)

The use of SOS substrates with their very low microwave loss may be advantageous for certain applications such as, for example, high speed RF devices. Although nanocrystalline diamond or UNCD provides for low microwave loss as compared to silicon, sapphire may exhibit the lowest microwave loss of any known material. The integration of sapphire substrates with nanocrystalline diamond or UNCD overlayers may offer the advantage of the low microwave loss of sapphire with the high thermal conductivity of diamond and its compatibility with silicon.

Devices formed in diamond are capable of very high temperature operation exceeding about 500° C. and are themselves reasonably radiation hard and with low microwave loss. However, the use of a sapphire substrate could further improve these attributes, leading to the possibility of devices capable of operating under even harsher environments that even conventional SOS devices. Additionally, the high band gap of diamond (3.2 eV) as compared to that of silicon (1.1 eV), allows for much less change in device and circuit parameter performance as a function of temperature, further extending the temperature range of operation and/or reducing the change in circuit performance across a given temperature range for these devices as compared to prior art SOS devices.

The use of diamond integrated circuit devices illustrated schematically in FIGS. 8a-8c may be simplified to use standard prior art conventional silicon substrates without sapphire. Single crystal silicon wafers are cheaper and less defect prone than SOS substrates and, therefore, this would decrease cost and improve manufacturability of devices using one or more of the inventive methods. Silicon lattice defects could propagate into the diamond and induce electrical defects such as junction or gate leakage. The use of a mature technology such as conventional silicon IC processing would greatly reduce or eliminate this concern. However, silicon is not as radiation hard as sapphire and its microwave loss is substantially higher. The choice of silicon or SOS substrates for NCD or UNCD devices could therefore depend upon the application. Applications requiring the highest levels of radiation hardness and the lowest levels of microwave loss would generally favor the use of SOS substrates for these NCD and UNCD ICs over conventional silicon substrates.

FIGS. 8-11 illustrate exemplary embodiments based on sapphire.

FIG. 8

An example of the integration of sapphire with NCD or UNCD is illustrated schematically in three device formation steps in FIGS. 8*a*-8*c*.

FIG. 8*a* illustrates schematically a starting SOS substrate which may be formed by conventional silicon epitaxy on a sapphire substrate or by the silicon to sapphire bonding technique described in U.S. Pat. No. 5,441,591 (Imthurn et al).

FIG. 8*b* shows the formation of an NCD or UNCD layer which is subjected to asperity removal.

FIG. 8*c* shows the selective formation of doped regions in the NCD or UNCD layer using known methods such as ion implantation using typical n-type dopants for diamond such as nitrogen or phosphorus and typical p-type dopants for diamond such as boron. Such doping could be followed by gate formation using known gate formation methods. Also, subsequent known contact and metalization steps, which are not shown in FIGS. 8*a*-8*c*, can be used.

FIG. 9

The processing sequence illustrated schematically in FIGS. 9*a*-9*d* is generally analogous to that shown in FIGS. 5*a*-5*d* except that NCD or UNCD on SOS substrates is utilized for the process illustrated in FIGS. 9*a*-*d* as opposed to NCD or UNCD on silicon (or other semiconductor) for the process illustrated in FIGS. 5*a*-*d*.

FIG. 9*a* illustrates the deposition of NCD or UNCD on a SOS substrate. This diamond is subject to asperity removal.

FIG. 9*b* illustrates the deposition of a solid bonding layer on the UNCD, preferably $SiO_2$.

FIG. 9*c* illustrates the DI bonding process with a second wafer covered with a similar solid bonding material, preferably $SiO_2$.

FIG. 9*d* illustrates the removal of the bulk of the semiconductor material leaving a thinned semiconductor device layer ready for subsequent device processing.

For both the process sequences shown in FIGS. 5*a*-5*d* and FIGS. 9*a*-9*d*, the resulting thinned semiconductor layer would be available for subsequent integrated circuit processing. A wide choice of semiconductor layers could be chosen for this active device layer, such as silicon, germanium, GaAs, AlGaAs, InP, CdS, InGaAs, and similar semiconductor substrates. The choice of single crystal silicon has many advantages for this layer such as low cost, process maturity and compatibility with a preferred bonding material, such as $SiO_2$. The use of diamond and sapphire substrates improves upon many of the properties of silicon, such as improved thermal conductivity, microwave loss, and radiation hardness. However, many of the other aforementioned substrates, such as GaAs can be utilized for their ability to be formed into lasers and other light-emitting devices. InP, for example, is capable of very high intrinsic device switching speeds due to the high intrinsic mobility of carriers in that substrate.

FIG. 10

The process sequence schematically illustrated in FIGS. 10*a*-10*d* for diamond on sapphire substrates is analogous to that shown in FIGS. 6*a*-6*d* for SOI substrates.

FIG. 10*a* illustrates the formation of a NCD or UNCD layer preferably on a silicon substrate. This layer can be subjected to asperity removal.

FIG. 10*b* schematically illustrates the patterning of the formed NCD or UNCD layer and the subsequent growth of epitaxial silicon in the areas opened up by patterning. A subsequent step is the formation of a second solid NCD or UNCD layer (preferably between 50 and 500 nm in thickness) and the deposition of bonding layer, preferably of $SiO_2$, which are not shown in FIG. 10. However, the resulting structure is shown in the bottom half of FIG. 10*c*. The top half of FIG. 10*c* is a sapphire wafer with a deposited bonding layer, preferably of $SiO_2$, which is inverted and bonded to the bottom wafer structure using prior art wafer bonding techniques. The thicknesses of the $SiO_2$ layers can be minimized using the inventive method for the formation of planarized NCD or UNCD layers. The total roughness of these layers can be economically reduced using the above-mentioned inventive methods to about 50 nm or less. The subsequent deposition of $SiO_2$ bonding layers can therefore proceed independent of the underlying roughness of the UNCD layer. $SiO_2$ thicknesses between about 50 nm and about 500 nm are preferred for this step for a total combined resultant preferred $SiO_2$ layer thickness between about 100 nm and about 1000 nm.

FIG. 10*d* illustrates the final structure awaiting integrated circuit processing after inversion of the previous structure shown in FIG. 10*c* and polishing (or grinding and then polishing) of the resultant combined wafer structure.

The final combined SOI/SOS structure illustrated schematically in FIG. 10*d* would form a highly desirable starting point for integrated circuit formation processes. The presence of the combined resultant $SiO_2$ layer would not impart a high degree of thermal resistance to the resultant structure because the use of UNCD planarized using the inventive methods described above would allow this bonding layer to be quite thin (preferably in the range of 100 nm-1000 nm). In addition, $SiO_2$ forms a strong bond with sapphire due the presence of strong interfacial bonds typical of aluminosilicates at the interface between $SiO_2$ and sapphire. An $SiO_2$-sapphire interface is therefore able to withstand substantial thermal stress without failure. The presence of UNCD underlying the epitaxial semiconductor device islands and in between the device areas on the surface as an insulator would offer substantial advantages for both thermal conductivity, radiation hardness and low parasitic capacitance. In addition, the presence of the sapphire substrate would offer very low microwave loss and excellent rad hardness.

FIG. 11

The process sequence schematically illustrated in FIGS. 11*a*-11*d* for the formation of insulating regions of UNCD on a SOS substrate is a minor but useful modification to prior art SOS device processing. The steps shown in FIG. 11*a* (starting SOS substrate) and FIG. 11*b* (shallow trench formation) are those typically utilized in SOS device formation. FIG. 11*c* illustrates the formation of planarized UNCD-filled shallow trenches subjected to asperity removal. FIG. 11*d* illustrates the typical next step in the device formation process, i.e. n and p-well formation, which would preferably follow typical prior art fabrication process methods.

The utility of NCD or UNCD planarized using the inventive methods as an isolation fill material for semiconductor device processing is not restricted to SOS substrates. Such NCD or UNCD material may be applied as an isolation fill material for conventional silicon substrates and other semiconductor substrates. Such NCD or UNCD-filled isolation would provide similar advantages for those semiconductor substrates.

Other Devices

The use of NCD or UNCD planarized using the asperity removal methods can also be used to address many of the concerns currently encountered when diamond is used as a construction material in other devices such as for example for surface acoustic wave (SAW).

Specifically, for an SAW application, the deposition problems with the piezoelectric material (e.g. crystal lattice axis misalignment) can be mitigated or largely eliminated because of the significant reduction in surface roughness that accompanies the removal of asperities, as discussed above. This may allow piezoelectric materials (e.g. ZnO, BaTiO3, Pb(ZrTi)O3, SrTiO3, KnbO3, polyvinylidene fluoride, and like materials), to be deposited directly on UNCD and reduce acoustic wave transmission losses at the interface and the accompanying insertion losses associated with circuits using such SAW devices.

Other Embodiments

Example A

Effect on Device Temperature Differentials of the Use of NCD or UNCD as a Replacement Dielectric for DI-SOI Typical $SiO_2$ thickness used in DI-SOI are on the order of between about 2 and about 5 μm. This relatively thick layer is chosen because of the requirement for isolation of the transistors from the substrate as well as the need for a planarized bonding material of sufficient thickness to form a strong bond between the two wafers being bonded. Modern microprocessors can produce average power densities between about 20 and about 50 W/cm². Local heating by large transistors operating under high power transient loads can produce local heat fluxes of at least ten times the average heating rate (i.e. 200-500 W/cm²). Using the example of an average heat flux of 50 W/cm², a $SiO_2$ dielectric thickness of 5 μm and a thermal conductivity for $SiO_2$ of 1.3 W/m° K. and utilizing the following heat transfer equation for the temperature differential ΔT between the heat producing area and the bottom of the $SiO_2$:

ΔT=Heat Rate×Thickness of insulator/(Thermal conductivity of material×Area of contact)

A ΔT of +19.2° C. can be calculated for the local temperature differential of this sample high power area, assuming that all of the heat is removed through the underlying $SiO_2$ dielectric. Even if 50% of the heat is removed through the metalization or other thermal conduction paths, the resulting ΔT of +9.6° C. is still a large departure from the assumption of isothermal conditions for all transistors under all operating conditions. If 3 μm of the 5 μm dielectric were replaced with UNCD leaving only about 2 μm of $SiO_2$ with 3 μm of UNCD, and if the same assumptions are made for heating rate, a ΔT of +7.8° C. can be calculated for the assumption of all the heat being removed through the underlying dielectric and a ΔT of +3.9° C. for the assumption of 50% heat removal through the underlying dielectric. A value for the thermal conductivity of UNCD of 200 W/m° K. is assumed in these calculations, which is considerably lower than the best possible thermal conductivity of deposited diamond (~2000 W/m° K.). Other values can be assumed for the NCD or UNCD and for example morphology and particle size can be varied to achieve a desired thermal conductivity. In both examples of the use of UNCD, the diamond provides almost no thermal resistance and the ΔT is almost entirely dependent on the thickness of the $SiO_2$ because of the substantially higher thermal conductivity of UNCD. NCD can be used also.

Example B

Effect on Device Temperature Differentials of the Use of NCD or UNCD as a Replacement Dielectric for DI-SOI and Copper (Cu) as a Replacement Bonding Material Using the assumption of 2 μm of Cu as a bonding material and 3 μm of UNCD for the SOI dielectric (see FIGS. 7a-7d) and using all the other assumptions as in Example 2 above, an insignificant ΔT of +0.1° C. can be calculated for the temperature differential of such a high power (500 W/cm²) region. This means that the dielectric layer would be essentially irrelevant in its effect on the local temperature experienced by even very high power regions of an integrated circuit fabricated using these materials and methods. This is similar to the temperature differentials that would be obtained from a similar calculation on modern, non-SOI, bulk silicon substrate, junction-isolated ICs. The thermal conductivity of silicon is about 148 W/m° K. A 500 W/cm² region on a 50 μm thick bulk silicon substrate IC would experience a ΔT of only +1.7° C. if all the heat was being dissipated through the underlying silicon. This means that nearly all of the temperature differential measurable in an SOI device using UNCD as the dielectric and Cu as the bonding material would occur from the top to the bottom of the substrate and not result in any significant local lateral differential heating of transistors or other high power devices. In this case, the +1.7° C. temperature differential would be evident only when measuring the temperature of the devices on the front side of a chip as compared to the back-side of the silicon substrate. The worst-case temperature differential between individual devices would be less than 1° C. because of the excellent thermal conductivity of the bulk silicon substrate.

The above mentioned examples for the application of the inventive method of planarizing diamond for use in Dielectric Isolation for IC fabrication (e.g. DI-SOI) demonstrates a practical relatively low-cost method of providing smooth diamond surfaces so that thin layers of other materials (e.g. $SiO_2$) can be efficiently deposited on top of them. The presence of asperities would inhibit or prevent the use of or the bonding of thin layers on top of the diamond because the asperities would effectively interfere with the deposition of layers on top of the diamond. Even if a thin layer could be deposited in spite of the presence of asperities, they would protrude from the surface of the thin layer and create friction or wear problems with the resulting composite surface. Even the deposition of thick layers (thicker than the height of the asperities) might be inhibited or lead to the formation of voids or stress fractures because of the hard diamond high aspect ratio asperities present on the surface. Asperity removal is therefore highly desirable and may even be a necessary prerequisite for the formation of tribologically smooth, low wear diamond surfaces or diamond surfaces coated with other layers.

The use of the inventive method of planarizing diamond for use in Dielectric Isolation for IC fabrication (e.g. DI-SOI) illustrates the utility of providing a smooth surface so that thin layers of other solid materials (e.g. $SiO_2$) can be deposited on top of the diamond. The invention can also be used to produce these tribologically smooth, low-wear diamond or diamond surfaces coated with other materials, for MEMS applications.

Many MEMS devices require hard durable surfaces or support members that are also smooth and low wear (e.g. MEMS cantilevers). The smoothness and hardness of the inventive diamond films, as well as their compatibility with other thin films (e.g. $SiO_2$), can reduce wear and friction, improve efficiency and extend the usable life-time of MEMS devices fabricated using these films. The inventive film planarization methods provide a relatively low cost method of producing such diamond coatings or diamond structures for MEMS devices.

Example C

The Use of Planarized NCD or UNCD as a Structural or Tribological Material for MEMS Devices The application of planarized UNCD to a MEMS application, specifically an AFM cantilever with integrated unitary UNCD probe tip, is shown schematically in FIG. 12a and FIG. 12b following many of the steps described in U.S. Pat. No. 5,221,415 (Albrecht et al.), herein incorporated as reference. FIG. 12a shows the use of <100> single crystal silicon as a sample substrate for a MEMS device, with a first sacrificial masking layer (e.g. silicon nitride, $Si_3N_4$) patterned using prior art techniques (not shown in FIG. 12a). Subsequent steps include the anisotropic etch of the patterned opening in the first sacrificial masking layer into the <100> silicon surface with an anisotropic silicon etchant (e.g. KOH) forming an angular etch preferentially along the <111> crystal plane, and the subsequent preferential deposition of UNCD into the resulting angular feature in the substrate and in the area allocated for the cantilever. The use of UNCD is a preferred material for this purpose because of the very small grain size of between about 1 and about 20 nm and the demonstrated ability of such films to fill very small features.

The deposited UNCD layer is shown schematically in FIG. 12a with a rough surface containing vertical positive asperities (shown with exaggerated vertical dimensions to help illustrate the problem). Removal or planarization of these asperities with the inventive methods is a highly desirable or necessary step for subsequent processing. Not only does their removal allow subsequent depositions and processing to be accomplished more quickly and easily, but the structural properties (e.g. sheer strength, vibrational frequency, etc.) will be more predictable and reproducible. The removal of the asperities is illustrated schematically in FIG. 12a with the downward pointing arrows. The resulting smoother surface is also illustrated in a different contrast.

Subsequent processing for the planarized UNCD layer is shown schematically in FIG. 12a. These processing steps include the deposition of a solid structural or active layer on top of the planarized UNCD. Such a deposition step could form highly structured or aligned crystallites due to the smooth surface resulting after asperity removal. A piezoelectric material (e.g. ZnO, $SrTiO_3$, polyvinylidene fluoride, (Pb$(ZrTi)O_3$, and like materials, can be deposited directly on the surface of the UNCD. Such a deposition and smooth surface can directly and indirectly enhance the piezoelectric properties of the composite structure because of the efficient propagation of acoustic waves through diamond and correctly aligned piezoelectric materials directly in contact with the UNCD surface. The subsequent processing steps include planarization of the structural cantilever material (e.g. a piezoelectric material) to leave it only in the opening processed in the second sacrificial masking layer using prior art techniques (not shown) and at least partial removal of the sacrificial layers and the substrate material. Sample etchants and suggested materials are shown in FIG. 12b.

UNCD with some or substantially all of its asperities removed according to the inventive methods can be used as a structural material for SAW devices as described in general above. Some of the prior art processing steps for the processing of SAW device with UNCD (without asperity removal) are contained in U.S. Pat. No. 5,221,415 (Bi et al.), herein incorporated as reference in its entirety. The processing necessary to produce a SAW device could proceed according to the various processing sequences described in Bi et al., with the additional necessary step of asperity removal according to the invention described herein. Such a processing sequence, including the deposition of piezoelectric material on the smoother, asperity free surface, would proceed according to the steps shown in FIGS. 12a and 12b but with lateral and vertical geometries and device sizes appropriate for a SAW device instead of the typically smaller dimensions appropriate for an AFM cantilever. The appropriate dimensions and geometries for AFM devices can be found in U.S. Pat. No. 5,221,415 (Albrecht et al.) and those for SAW devices can be in U.S. Pat. No. 5,221,415 (Bi et al.).

Example D

In another embodiment, UNCD coated silicon wafers can be polished for periods of up to about 40 minutes using CMP slurries known in the art to remove about 20 nm or less, or about 10 nm or less, of UNCD. Surface roughness reductions of at least a factor of ten can be achieved. The surfaces can be bonded to, for example, pyrex wafers.

Working Examples

The following non-limiting examples set forth additional exemplary embodiments:

Example 1

Removal of Asperities to Planarize UNCD and Form a Hard Low-Wear Surface

Diamond films with an approximate thickness of 2 μm were deposited on nine SiC cylindrical seals. See US Patent Publication No. 2005/0031785 to Carlisle et al. (Ser. No. 10/892,736). The diamond coatings on these nine SiC seals are UNCD films deposited by reacting methane and hydrogen at elevated temperatures at pressures below atmosphere in a CVD process.

A pictorial view of the roughness including substantial asperities can be assessed from the representative 50×50 μm AFM 2D topographical map as shown in FIG. 1. The resulting deposited films were measured for surface roughness using an Ambios XP1 2D contact line profilometer and analyzed using TrueGage's TrueSurf analysis software. The stylus end radius for the profilometer was about 2.50 μm. The diamond films had an average surface roughness (Ra) of approximately 20.5 nm as shown in FIG. 6 ("UNCD as deposited"). The average initial roughness of the SiC seal end-faces ("initial SiC surface") as shown in FIG. 6, was 7.6 nm. The outer diameter of the seals was 2.000 inches (5.08 cm) and the inner diameter was 1.375 inches (3.49 cm) with a total surface area of 1.657 inch$^2$ (10.69 cm$^2$) for the end subject to diamond film deposition.

Figure 2:
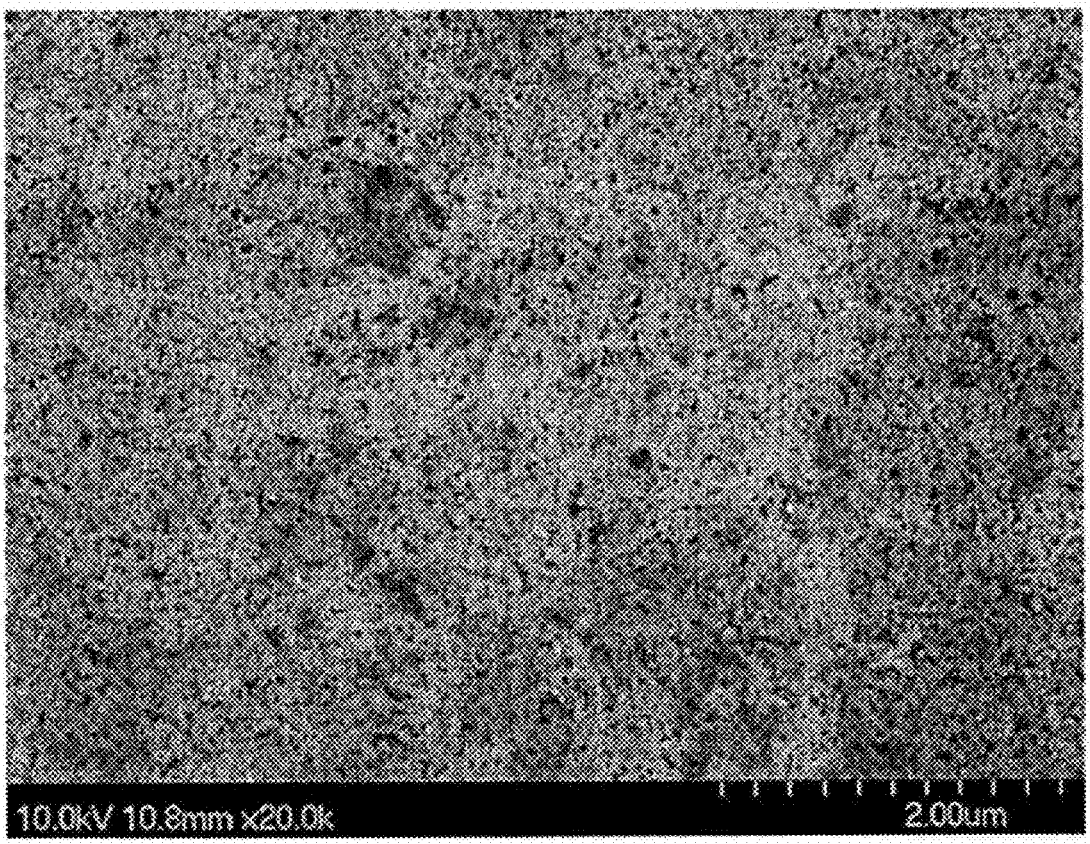
FIG. 2 is a scanning electron micrograph of a UNCD film planarized by methods described herein.
Figure 3:
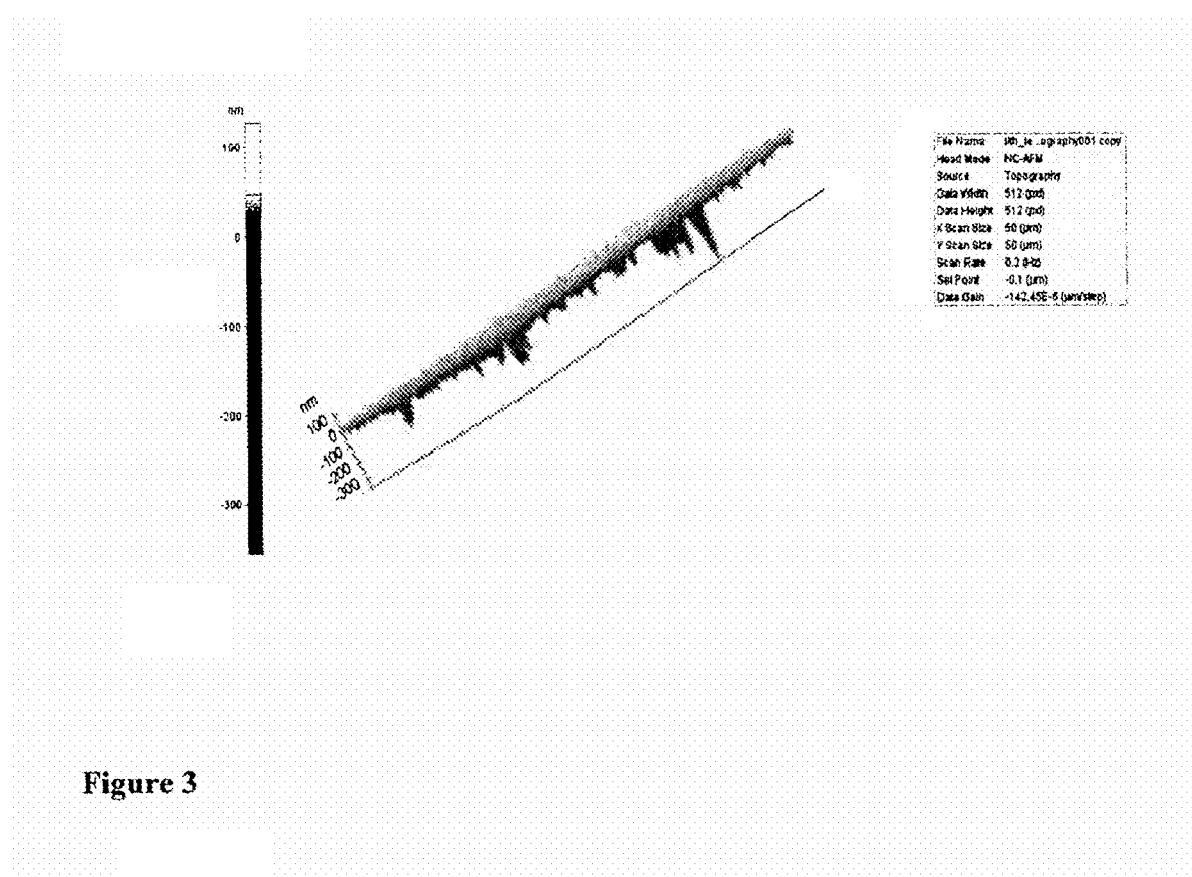
FIG. 3 shows AFM data illustrating in cross-sectional analysis particular depressions in the surface which remain after planarizing.
Figure 4:
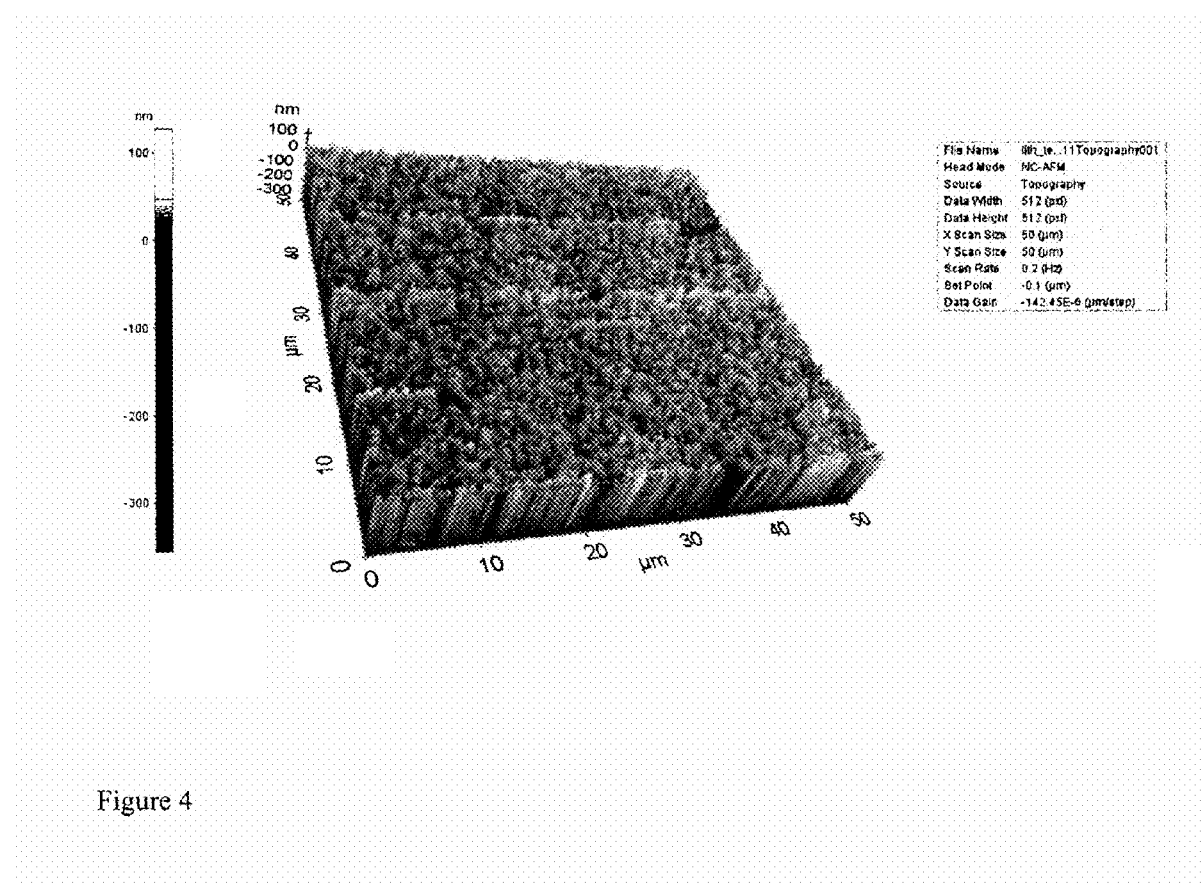
FIG. 4 shows AFM data illustrating in perspective view the surface after planarizing.

The diamond films were subsequently polished for 90 sec on an industry-standard planetary polishing system (Lapmaster 15 Diamond Lapping Polishing System) with a downforce of approximately 1 psi (6.89 kN/m²). A liquid particle diamond polishing slurry with an average particle size of about 6 μm was delivered to the film surface. The slurry had a pH of approximately 7. After polishing, the nine diamond end-face films deposited on the SiC seals exhibited an average "post-polish" surface roughness (Ra) of 8.8 nm as shown in FIG. 6. A SEM micrograph of the polished surface of a UNCD film is also shown in FIG. 2. The contrast between light and dark features in the SEM is the attributable to the polycrystalline diamond grains with grain sizes of the order of 10-50 nm. AFM analysis of the planarized surface is shown in FIGS. 3-5. The analysis was conducted using an XE-HDD scanning probe by Park Systems (formerly PSIA) and XEI analysis software running in "contact mode" or "tapping mode."

Analysis of the asperity count on the initial SiC surface, the UNCD film after deposition, and the post-polish surface was also conducted using the above-mentioned equipment and software. Asperities were defined as regions of the surface of greater than 100 nm in height above the surface. The asperity count data for 6 SiC seals are shown in FIG. 7. The asperity count in this figure results from counting of the number of localized peaks or asperities that have a height substantially above the surfaces roughness. The asperity count depicted in FIG. 7 resulted from a noting the number of localized peaks within a profilometry scan made by a contacting with a diamond stylus having a tip diameter of about 2 microns.

The average asperity count for asperities of 100 nm or greater for the "initial SiC" surface is 11.72/mm and that for the "as deposited UNCD" film surface is 26.52/mm and for the "post-polish" surface is 3.17/mm. The reduction in asperity count for the post-polish surface as compared to even the initial relatively smooth initial SiC surface is evidence for the effectiveness in producing tribological low wear surfaces. The effectiveness of this planarization process is due mainly to the relatively low bulk roughness of the UNCD film (as opposed to the asperities present on its surface) in combination with the inexpensive and efficacious post-deposition asperity removal process. Moreover, a short 90 second polish was sufficient to remove substantially the narrow positive asperities while being insufficient to planarize substantially the "negative asperities" extending below the average height of the surface.

Samples of these UNCD-coated seal faces were also tested for reduced wear and their ability to reduce the wear of the uncoated often softer counter face. The wear testing included running Type 8-1 seals in hot-water with a temperature of 250° F., pressure of 100 psig, and flush flow of water at 20 GPM in an industrial pump to running against P685RC (carbon) primary faces for 100 hours at 3,450 RPM. The resulting wear of the carbon faces was below 0.00000" on the two seals run in the same test. The wear for the carbon face run in the same test conditions without the UNCD-film being surface finished according to the procedure in this application was 0.00246".

Samples of these UNCD-coated seals were also tested for their coefficient of sliding friction (CoF) against uncoated SiC seals ("hard" on "hard" sliding friction) on an industry-standard friction tester. The friction test rig used for this analysis was a custom apparatus that was calibrated against a similar rig located at John Crane, Inc. The friction rig evaluates the CoF of actual John Crane Type 8-1 seals with a shaft diameter of 1.375" by dynamically measuring the face loading, torque, seal and liquid media temperature and shaft RPM. Several CoF measurements were performed on these films which exhibited a typical CoF with SiC of 0.018 as compared to a literature CoF for cleaved natural diamond of about 0.10 according to U.S. Pat. No. 5,898,511 (Gruen et. al).

The following 108 embodiments are described further in U.S. provisional application Ser. No. 61/019,175 filed Jan. 4, 2008, which is hereby incorporated by reference in its entirety:

Embodiment

1. A method comprising:
providing at least one first diamond film comprising nanocrystalline or ultrananocrystalline diamond disposed on a substrate, wherein the first diamond film comprises a surface comprising diamond asperities and having a first diamond film thickness,
removing asperities from the first diamond film to form a second diamond film having a second diamond film thickness, wherein the second thickness is either substantially the same as the first thickness, or the second thickness is about 100 nm or less thinner than the first diamond film thickness,
optionally patterning the second diamond film to expose substrate regions and, optionally, depositing semiconductor material on the exposed substrate regions,
depositing a solid layer on the optionally patterned second diamond film to form a first layered structure.
2. The method of 1, wherein the solid layer comprises an electrical insulator.
3. The method of 1, wherein the solid layer comprises an electrical conductor.
4. The method of 1, wherein the solid layer comprises a semiconductor.
5. The method of 1, wherein the solid layer comprises a piezoelectric material.
6. The method of 1, wherein the solid layer comprises an oxide.
7. The method of 1, wherein the solid layer comprises a metal.
8. The method of 1, wherein the solid layer comprises additional nanocrystalline or ultrananocrystalline diamond.
9. The method of 1, wherein the solid layer comprises silicon dioxide.
10. The method of 1, wherein the solid layer comprises copper.
11. The method of 1, wherein the solid layer is adapted for a bonding process
12. The method of 1, wherein the substrate is a semiconductor substrate.
13. The method of 1, wherein the substrate is a silicon, GaAs, InP, SiC, or SiGe substrate.
14. The method of 1, wherein the substrate is a silicon substrate.
15. The method of 1, wherein the substrate comprises a sapphire layer and a silicon interlayer.
16. The method of 1, wherein the substrate comprises a sapphire layer and an etched silicon interlayer.
17. The method of 1, wherein the first thickness is about 200 nm to about four microns.
18. The method of 1, wherein the second thickness is about 10 nm or less thinner than the first diamond film thickness.
19. The method of 1, wherein the second thickness is substantially the same as the first thickness.
20. The method of 1, wherein the film comprises nanocrystalline diamond.
21. The method of 1, wherein the film comprises ultrananocrystalline diamond.
22. The method of 1, further comprising the step of bonding the solid layer of the first layered structure to a second layered structure comprising a semiconductor substrate and a bonding layer.

23. The method of 1, further comprising the steps of (i) bonding the solid layer of the first layered structure to a second layered structure comprising a semiconductor substrate and a bonding layer, and (ii) thinning the semiconductor substrate to form a semiconductor device layer.

24. The method of 1, comprising the step of patterning the second diamond film to expose substrate regions and depositing semiconductor material on the exposed substrate regions.

25. The method of 1, comprising the step of patterning the second diamond film to expose substrate regions and depositing epitaxial silicon on the exposed substrate regions 26. The method of 1, wherein the second diamond film has an average surface roughness of about 50 nm or less, and also has an average grain size of about 20 nm or less.

27. The method according to 1, wherein the second diamond film has fewer than about 10 asperities per square centimeter, wherein the asperities have a height/width ratio of greater than about 1:1 and a height above the average height of surface of the film of greater than about three times the average surface roughness.

28. The method of 1, wherein the removal step is carried out for about 60 minutes or less.

29. The method of 1, wherein the removal step comprises exposure to plasma, or comprises polishing the asperities with an abrasive material, or comprises subjecting to laser ablation, or comprises isotropic etching.

30. The method of 1, wherein the solid layer is a solid layer of silicon dioxide or copper, wherein the diamond film comprises UNCD, and the substrate is a silicon substrate.

Embodiment

31. A method comprising:
fabricating at least one semiconductor device comprising device elements in a semiconductor device layer and a substrate, wherein the fabrication comprises at least one step comprising forming a nanocrystalline or ultrananocrystalline diamond film which is adapted for electrically insulating device elements from the substrate and also adapted for providing thermal conductivity pathways between device elements and the substrate, wherein the diamond film as formed comprises asperities which are subjected to an asperity removal step.

32. The method of 1, wherein the method comprises forming an ultrananocrystalline diamond film.

33. The method of 1, wherein the diamond film is in direct contact with the substrate.

34. The method of 1, wherein the diamond film is in direct contact with the semiconducting device layer.

35. The method of 1, wherein the device comprises two bonding layers bonded together and disposed on the diamond layer.

36. The method of 1, wherein the semiconducting device layer also comprises patterned nanocrystalline or ultrananocrystalline diamond.

37. The method of 1, wherein the semiconducting device layer comprises epitaxial silicon.

38. The method of 1, wherein the asperity removal step is carried out for 60 minutes or less.

39. The method of 1, wherein the substrate comprises silicon or sapphire.

40. The method of 1, wherein the diamond film functions with a second layer to provide dielectric isolation in a composite dielectric isolation layer.

Embodiment

41. A method comprising:
providing at least one first diamond film comprising diamond disposed on a substrate, wherein the first diamond film comprises a surface comprising diamond asperities and having a first diamond film thickness,
removing asperities from the first diamond film to form a second diamond film having a second diamond film thickness, wherein the second thickness is either substantially the same as the first thickness, or the second thickness is about 100 nm or less thinner than the first diamond film thickness, and wherein the second diamond film has an average grain size of about 20 nm or less and an average surface roughness of about 50 nm or less,
depositing a solid layer on the second diamond film to form a first layered structure.

42. The method of 41, wherein the second diamond film is patterned after the removing step but before the depositing step.

43. The method of 41, wherein the first diamond film is patterned after the providing step but before the removing step.

44. The method of 41, wherein the first diamond film is a UNCD diamond film.

45. The method of 41, wherein the removal step is carried out for 60 minutes or less.

46. The method of 41, wherein substrate comprises silicon or sapphire.

47. The method of 41, wherein the second diamond film has an average grain size of about 10 nm or less and an average surface smoothness of about 20 nm or less.

48. The method of 41, wherein the solid layer comprises an electrical insulator.

49. The method of 41, wherein the solid layer comprises silicon dioxide.

50. The method of 41, wherein the solid layer is a made from a material adapted to be bonded to another layer made of the same material.

Embodiment

51. A method comprising:
providing at least one first diamond film comprising polycrystalline or ultrananocrystalline diamond disposed on a substrate, wherein the first diamond film comprises a surface comprising diamond asperities and having a first diamond film thickness,
removing asperities from the first diamond film to form a second diamond film having a second diamond film thickness, wherein the second thickness is either substantially the same as the first thickness, or the second thickness is about 100 nm or less thinner than the first diamond film thickness,
depositing a solid layer on the second diamond film, wherein the material of the solid layer is selected to be adapted for direct bonding to another layer of the same material.

52. The method of 51, wherein the diamond film comprises UNCD.

53. The method of 51, wherein the removal step is carried out for about 60 minutes or less.

54. The method of 51, wherein the material of the solid layer is silicon dioxide or copper.

55. The method of 51, wherein the first and second thickness are substantially the same.

Embodiment

56. A method comprising:

providing at least one first diamond film comprising nanocrystalline or ultrananocrystalline diamond disposed on a substrate, wherein the first diamond film comprises a surface comprising diamond asperities and having a first diamond film thickness, removing asperities from the first diamond film to form a second diamond film having a second diamond film thickness, wherein the second thickness is either substantially the same as the first thickness, or the second thickness is about 100 nm or less thinner than the first diamond film thickness, patterning the second diamond film to expose substrate regions and depositing semiconductor material on the exposed substrate regions, depositing an additional third layer of nanocrystalline or ultrananocrystalline diamond on the first diamond film and semiconductor material, depositing a solid layer on the third diamond film.

57. The method of 56, wherein the first diamond film comprises UNCD.

58. The method of 56, wherein the material of the solid layer is selected to be adapted for direct bonding to another layer of the same material.

59. The method of 56, wherein the substrate comprises silicon or sapphire.

60. The method of 56, wherein the second thickness is either substantially the same as the first thickness, or the second thickness is about 10 nm or less thinner than the first diamond film thickness.

Embodiment

61. A device comprising:

a plurality of semiconducting device elements and an insulating substrate, wherein the device elements are dielectrically isolated by one or more layers which comprise at least one layer of NCD or UNCD.

62. The device according to 61, wherein the device comprises at least two bonding layers bonded to each other.

63. The device according to 61, wherein the device comprises at least two silicon dioxide bonding layers bonded to each other.

64. The device according to 61, wherein the device comprises at least two copper bonding layers bonded to each other.

65. The device according to 61, wherein the NCD or UNCD layer is disposed directly on the substrate.

66. The device according to 61, wherein the NCD or UNCD layer is disposed directly next to a device active layer comprising the plurality of semiconducting device elements.

67. The device according to 61, wherein the device comprises at least one layer of UNCD.

68. The device of 61, wherein the plurality of semiconducting device elements are separated from each other by patterned NCD or UNCD.

69. The device of 61, wherein the device comprises at least one substrate, at least one layer of NCD or UNCD disposed on the substrate, at least two bonding layers bonded together, one first bonding layer disposed on the NCD or UNCD layer, and one second bonding layer disposed on and bonded to the first bonding layer, at least one semiconductor device layer disposed on the second bonding layer and comprising the plurality of semiconducting device elements.

70. The device of 61, wherein the device comprises at least one substrate, at least two bonding layers bonded together, one first bonding layer disposed on the substrate, and one second bonding layer disposed on and bonded to the first bonding layer, at least one layer of NCD or UNCD disposed on the second bonding layer, at least one semiconductor device layer disposed on the NCD or UNCD layer and comprising the plurality of semiconducting device elements.

71. The device of 61, wherein the NCD or UNCD is substantially free of asperities.

72. The device of 61, wherein the substrate comprises sapphire and a silicon interlayer disposed thereon.

73. The device of 61, wherein the plurality of semiconducting device elements comprise NCD or UNCD.

74. The device of 61, wherein the plurality of semiconducting device elements is disposed in a silicon layer.

75. The device of 61, wherein the plurality of semiconducting device elements is disposed in a silicon layer which has been etched and the etched regions filled with NCD or UNCD.

76. The device according to 61, wherein the device is an integrated circuit device.

77. The device according to 61, wherein the device is a surface acoustic wave device.

78. The device according to 61, wherein the device is an atomic force microscope device.

79. The device according to 61, wherein the device is a scanning probe microscope device.

80. The device according to 61, wherein the one or more layers which comprise at least one layer of NCD or UNCD function with a different insulating layer to form composite dielectric isolation layers.

Embodiment

81. A device comprising:

at least one substrate, at least one layer of NCD or UNCD disposed on the substrate, at least two bonding layers bonded together, one first bonding layer disposed on the NCD or UNCD layer, and one second bonding layer disposed on and bonded to the first bonding layer, at least one semiconductor device layer disposed on the second bonding layer.

82. The device of 81, wherein the device comprises at least one layer of UNCD disposed on the substrate.

83. The device of 81, wherein the substrate comprises silicon or sapphire.

84. The device of 81, wherein the bonding layers comprise silicon dioxide.

85. The device of 81, wherein the bonding layers comprise copper.

86. The device of 81, wherein the NCD or UNCD has a higher thermal conductivity than the material of the bonding layer.

87. The device of 81, wherein the layer of NCD or UNCD has a thickness of about 200 nm to about 4 microns.

88. The device of 81, wherein the layer of NCD or UNCD is substantially free of asperities.

89. The device of 81, wherein the layer of NCD or UNCD is thicker than the thickness of the two bonding layers together.

90. The device of 81, wherein the bonding layers are silicon dioxide bonding layers and the layer of NCD or UNCD is thicker than the thickness of the two silicon dioxide bonding layers together.

Embodiment

91. A device comprising:
    at least one substrate,
    at least two bonding layers bonded together, one first bonding layer disposed on the substrate, and one second bonding layer disposed on and bonded to the first bonding layer,
    at least one layer of NCD or UNCD disposed on the second bonding layer,
    at least one semiconductor device layer disposed on the NCD or UNCD layer.
92. The device of 91, wherein the device comprises at least one layer of UNCD disposed on the second bonding layer.
93. The device of 91, wherein the substrate comprises silicon or sapphire.
94. The device of 91, wherein the bonding layers comprise silicon dioxide.
95. The device of 91, wherein the bonding layers comprise copper.
96. The device of 91, wherein the NCD or UNCD has a higher thermal conductivity than the material of the bonding layer.
97. The device of 91, wherein the semiconductor device layer comprises NCD or UNCD which has a layer thickness of about 30 nm to about 300 nm.
98. The device of 91, wherein the layer of NCD or UNCD is substantially free of asperities.
99. The device of 91, wherein the layer of NCD or UNCD is thicker than the thickness of the two bonding layers together.
100. The device of 91, wherein the semiconducting device layer comprises NCD or UNCD.

Embodiment

101. An article comprising at least one cantilever, wherein the cantilever comprises a diamond film comprising nanocrystalline or ultrananocrystalline diamond and comprising a surface disposed next to a solid layer which is substantially free of asperities.
102. The article of 101, wherein the solid layer comprises piezoelectric material.
103. The article of 101, wherein the cantilever comprises a scanning probe microscope tip.
104. The article of 101, wherein the cantilever comprises an atomic force microscope tip.

Embodiment

105. A method comprising:
    fabricating a cantilever, wherein the cantilever fabrication comprises
    depositing diamond film comprising nanocrystalline or ultrananocrystalline diamond and comprising a surface comprising asperities, and
    removing asperities from the surface.
106. The method of 105, wherein after removing asperities from the surface, a solid layer is deposited on the surface.
107. The method of 105, wherein the removing step is limited so that any depressions in the surface are not substantially affected by the removing step.
108. The method of 105, wherein after removing asperities from the surface, a solid layer is deposited on the surface comprising piezoelectric material.
    This concludes the 108 embodiments.

What is claimed is:

1. A method comprising:
   providing a substrate;
   depositing at least one first diamond film comprising UNCD onto the substrate, wherein the first diamond film comprises a surface comprising diamond asperities and having a first diamond film thickness;
   after the step of depositing the at least one first diamond film on the substrate, removing asperities from the first diamond film to form a second diamond film having a second diamond film thickness, wherein the second thickness is either substantially the same as the first thickness, or the second thickness is about 100 nm or less thinner than the first diamond film thickness, and
   depositing a solid layer on at least a portion of the second diamond film to form a first layered structure.

2. The method of claim 1, wherein the solid layer comprises an electrical insulator, an electrical conductor, a semiconductor, or a piezoelectric material.

3. The method of claim 1, wherein the solid layer comprises an oxide or a metal.

4. The method of claim 1, wherein the solid layer comprises additional polycrystalline diamond.

5. The method of claim 1, wherein the substrate is a semiconductor substrate.

6. The method of claim 1, wherein the substrate comprises a sapphire layer and a silicon interlayer.

7. The method of claim 1, wherein the first thickness is about 200 nm to about four microns.

8. The method of claim 1, wherein the second thickness is about 10 nm or less thinner than the first diamond film thickness.

9. The method of claim 1, wherein the second thickness is substantially the same as the first thickness.

10. The method of claim 1, further comprising the step of bonding the solid layer of the first layered structure to a second layered structure comprising a semiconductor substrate and a bonding layer.

11. The method of claim 1, further comprising the steps of (i) bonding the solid layer of the first layered structure to a second layered structure comprising a semiconductor substrate and a bonding layer, and (ii) thinning the semiconductor substrate to form a semiconductor device layer.

12. The method of claim 1, comprising the step of patterning the second diamond film to expose substrate regions and depositing semiconductor material on the exposed substrate regions.

13. The method according to claim 1, wherein the second diamond film has fewer than about 10 asperities per square centimeter, wherein the asperities have a height/width ratio of greater than about 1:1 and a height above the average height of surface of the film of greater than about three times the average surface roughness.

14. The method of claim 1, wherein the removal step is carried out for about 60 minutes or less.

15. The method of claim 1, wherein the solid layer is a solid layer of silicon dioxide or copper, and the substrate is a silicon substrate.

16. A method comprising:
    providing a substrate;
    depositing at least one first diamond film comprising UNCD onto the substrate, wherein the first diamond film comprises a surface with an unpolished average roughness of less than 50 nm and having a first diamond film thickness;
    after the step of depositing the at least one first diamond film on the substrate, processing the first diamond film to form a second diamond film having a second diamond film thickness, wherein the second thickness is either substantially the same as the first thickness, or the second thickness is about 100 nm or less thinner than the first diamond film thickness and the surface roughness is less than 10 nm;

optionally patterning the second diamond film to expose substrate regions and, optionally, depositing semiconductor material on the exposed substrate regions; and depositing a solid layer.

17. The method of claim 16, wherein the processing comprises polishing the surface with an abrasive for less than 60 minutes.

18. A method comprising:
fabricating at least one semiconductor device comprising device elements in a semiconductor device layer and a substrate, wherein the fabrication comprises at least one step comprising forming a UNCD film which is adapted for electrically insulating device elements from the substrate and also adapted for providing thermal conductivity pathways between device elements and the substrate, wherein the diamond film as formed has an Ra of about 20 nm or less and has a first thickness, and is subjected to a diamond removal step which comprises removing about 25 nm or less of diamond from the first thickness.

19. A method comprising:
providing a substrate;
depositing at least one first diamond film comprising UNCD onto the substrate, wherein the first diamond film comprises a surface comprising diamond asperities and having a first diamond film thickness;
after the step of depositing the at least one first diamond firm on the substrate, removing asperities from the first diamond film to form a second diamond film having a second diamond film thickness, wherein the second thickness is either substantially the same as the first thickness, or the second thickness is about 100 nm or less thinner than the first diamond film thickness, and wherein the second diamond film has an average grain size of about 20 nm or less and an average surface roughness of about 50 nm or less; and
depositing a solid layer on the second diamond film to form a first layered structure.

20. A method comprising:
providing a substrate;
depositing at least one first diamond film comprising UNCD onto the substrate, wherein the first diamond film comprises a surface comprising diamond asperities and having a first diamond film thickness,
removing asperities from the first diamond film to form a second diamond film having a second diamond film thickness, wherein the second thickness is either substantially the same as the first thickness, or the second thickness is about 100 nm or less thinner than the first diamond film thickness,
depositing a solid layer on the second diamond film, wherein the material of the solid layer is selected to be adapted for direct bonding to another layer of the same material.

21. A method comprising:
providing a substrate;
depositing at least one first diamond film comprising UNCD onto the substrate, wherein the first diamond film comprises a surface comprising diamond asperities and having a first diamond film thickness,
removing asperities from the first diamond film to form a second diamond film having a second diamond film thickness, wherein the second thickness is either substantially the same as the first thickness, or the second thickness is about 100 nm or less thinner than the first diamond film thickness;
patterning the second diamond film to expose substrate regions;
depositing semiconductor material on the exposed substrate regions;
depositing an additional third layer of polycrystalline diamond on the first diamond film and semiconductor material; and
depositing a solid layer on the third diamond film.

22. A method comprising:
providing at least one first diamond film comprising polycrystalline diamond disposed on a substrate, wherein the first diamond film comprises a surface comprising diamond asperities and having a first diamond film thickness;
removing asperities from the first diamond film to form a second diamond film having a second diamond film thickness, wherein the second thickness is either substantially the same as the first thickness, or the second thickness is about 100 nm or less thinner than the first diamond film thickness; optionally patterning the second diamond film to expose substrate regions and, optionally, depositing semiconductor material on the exposed substrate regions; and
depositing a solid layer on the optionally patterned second diamond film to form a first layered structure,
wherein the solid layer is a solid layer of silicon dioxide or copper,
wherein the diamond film comprises UNCD, and
wherein the substrate is a silicon substrate.

23. The method of claim 1, wherein the solid layer is a solid layer of silicon dioxide or copper.

24. The method of claim 1, wherein the substrate is a silicon substrate.

25. A method comprising:
providing a substrate;
depositing at least one diamond film comprising UNCD onto the substrate;
performing an asperity removal step on the at least one diamond film comprising UNCD for a period of 60 minutes or less; and
depositing a solid layer on at least a portion of the at least one diamond film to form a first layered structure.

26. The method of claim 25, wherein the asperity removal step is performed for a period of 30 minutes or less.

27. The method of claim 25, wherein the asperity removal step is performed for a period between 2 minutes and 10 minutes.

28. The method of claim 25, wherein the asperity removal step is performed for a period between 1 minute and 10 minutes.

29. The method of claim 25, wherein the asperity removal step comprises a chemical mechanical planarization process.

* * * * *